United States Patent
Lu et al.

(10) Patent No.: US 9,614,143 B2
(45) Date of Patent: Apr. 4, 2017

(54) DE-INTEGRATED TRENCH FORMATION FOR ADVANCED MRAM INTEGRATION

(71) Applicant: QUALCOMM Incorporated, San Diego, CA (US)

(72) Inventors: Yu Lu, San Diego, CA (US); Wei-Chuan Chen, Taipei (TW); Seung Hyuk Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/735,006

(22) Filed: Jun. 9, 2015

(65) Prior Publication Data

US 2016/0365505 A1    Dec. 15, 2016

(51) Int. Cl.
| | |
|---|---|
| H01L 43/02 | (2006.01) |
| H01L 43/08 | (2006.01) |
| H01L 43/12 | (2006.01) |
| H01L 27/22 | (2006.01) |
| H01L 43/10 | (2006.01) |

(52) U.S. Cl.
CPC ............ H01L 43/02 (2013.01); H01L 27/222 (2013.01); H01L 43/08 (2013.01); H01L 43/10 (2013.01); H01L 43/12 (2013.01)

(58) Field of Classification Search
CPC ... H01L 27/222; H01L 27/226; H01L 27/228; H01L 21/76852; H01L 43/08; H01L 43/02; H01L 45/06; H01L 45/1233; H01L 45/1675

See application file for complete search history.

(56) References Cited

U.S. PATENT DOCUMENTS

| | | | |
|---|---|---|---|
| 6,211,090 B1 * | 4/2001 | Durlam | B82Y 10/00 216/22 |
| 6,806,096 B1 | 10/2004 | Kim et al. | |
| 7,083,990 B1 | 8/2006 | Leuschner | |
| 7,122,386 B1 | 10/2006 | Torng et al. | |
| 7,344,896 B2 | 3/2008 | Leuschner et al. | |
| 7,605,420 B2 | 10/2009 | Furuta et al. | |
| 7,635,884 B2 | 12/2009 | Gaidis et al. | |

(Continued)

FOREIGN PATENT DOCUMENTS

WO     2010051010 A1     5/2010

OTHER PUBLICATIONS

Partial International Search Report—PCT/US2016/030705—ISA/EPO—Aug. 3, 2016.

(Continued)

*Primary Examiner* — Dale E Page
*Assistant Examiner* — John Bodnar
(74) *Attorney, Agent, or Firm* — Seyfarth Shaw LLP

(57) ABSTRACT

A semiconductor device may include a magnetoresistive random-access memory (MRAM) trench having a first conductive barrier liner and a second conductive barrier liner. The MRAM trench may land on a hard mask of a magnetic tunnel junction (MTJ) within an MTJ region of the semiconductor device. The semiconductor device may also include a logic trench having the first conductive barrier liner. The semiconductor device may further include a logic via having the first conductive barrier liner. The logic via may land on a first portion of a conductive interconnect (Mx) within a logic region of the semiconductor device.

10 Claims, 26 Drawing Sheets

(56) References Cited

U.S. PATENT DOCUMENTS

| | | |
|---|---|---|
| 7,833,806 B2 | 11/2010 | Smith et al. |
| 8,455,267 B2 | 6/2013 | Li et al. |
| 8,492,808 B2 | 7/2013 | Omori et al. |
| 2005/0095855 A1* | 5/2005 | D'urso ................ C23C 18/1605<br>438/678 |
| 2006/0019487 A1* | 1/2006 | Leuschner .............. G11C 11/16<br>438/637 |
| 2006/0022286 A1* | 2/2006 | Leuschner ........ H01L 21/76852<br>257/421 |
| 2007/0105241 A1* | 5/2007 | Leuschner ........ H01L 21/76852<br>438/3 |
| 2012/0193601 A1* | 8/2012 | Tsukamoto ............. G11C 11/16<br>257/5 |
| 2013/0032907 A1* | 2/2013 | Satoh ...................... H01L 45/04<br>257/421 |
| 2014/0001556 A1 | 1/2014 | Arai |
| 2014/0264679 A1* | 9/2014 | Lee ........................ H01L 43/12<br>257/427 |

OTHER PUBLICATIONS

International Search Report and Written Opinion—PCT/US2016/030705—ISA/EPO—Oct. 24, 2016.

* cited by examiner

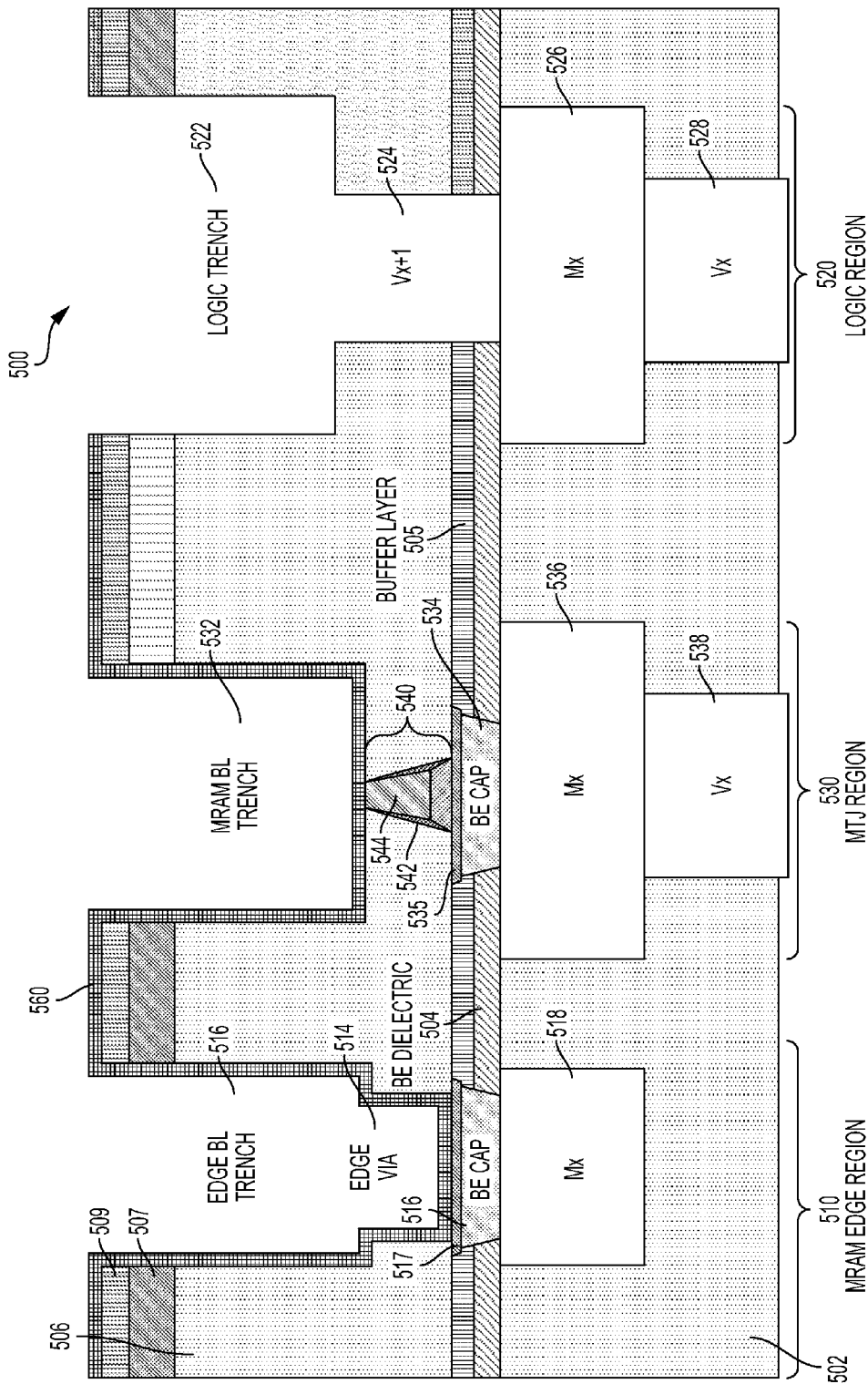

DE-INTEGRATED TRENCH FORMATION FOR ADVANCED MRAM INTEGRATION

BACKGROUND

Field

Certain aspects of the present disclosure generally relate to magnetic tunneling junction (MTJ) devices, and more particularly to a de-integrated trench formation for advance magnetic random access memory (MRAM) integration.

Background

Unlike conventional random access memory (RAM) chip technologies, in magnetic RAM (MRAM), data is stored by magnetization of storage elements. The basic structure of the storage elements consists of metallic ferromagnetic layers separated by a thin tunneling barrier. Typically, one of the ferromagnetic layers, for example the ferromagnetic layer underneath the barrier have a magnetization that is fixed in a particular direction, is commonly referred to as the pinned layer. The other ferromagnetic layers (e.g., the ferromagnetic layer above the tunneling barrier) have a magnetization direction that may be altered to represent either a "1" or a "0", and are commonly referred to as the free layers. For example, a "1" may be represented when the free layer magnetization is anti-parallel to the fixed layer magnetization. In addition, a "0" may be represented when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel to each other. A memory device such as MRAM is built from an array of individually addressable MTJs.

To write data in a conventional MRAM, a write current, which exceeds a critical switching current, is applied through an MTJ. Application of a write current that exceeds the critical switching current changes the magnetization direction of the free layer. When the write current flows in a first direction, the MTJ may be placed into or remain in a first state in which its free layer magnetization direction and fixed layer magnetization direction are aligned in a parallel orientation. When the write current flows in a second direction, opposite to the first direction, the MTJ may be placed into or remain in a second state in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a parallel resistance. The parallel resistance is different than a resistance (anti-parallel) the MTJ would present if the magnetizations of the free layer and the fixed layer were in an anti-parallel orientation. In a conventional MRAM, two distinct states are defined by these two different resistances of an MTJ in a bitcell of the MRAM. The two different resistances indicate whether a logic "0" or a logic "1" value is stored by the MTJ.

Spin-transfer-torque magnetic random access memory (STT-MRAM) is an emerging nonvolatile memory that has advantages of non-volatility. In particular, STT-MRAM embedded with logic circuits may operate at a higher speed than off chip dynamic random access memory (DRAM). In addition, STT-MRAM has a smaller chip size than embedded static random access memory (eSRAM), virtually unlimited read/write endurance as compared with FLASH, and a low array leakage current.

SUMMARY

A semiconductor device may include a magnetoresistive random-access memory (MRAM) trench having a first conductive barrier liner and a second conductive barrier liner. The MRAM trench may land on a hard mask of a magnetic tunnel junction (MTJ) within an MTJ region of the semiconductor device. The semiconductor device may also include a logic trench having the first conductive barrier liner. The semiconductor device may further include a logic via having the first conductive barrier liner. The logic via may land on a first portion of a conductive interconnect (Mx) within a logic region of the semiconductor device.

A method of fabricating a semiconductor device may include fabricating a logic trench and a logic via. The method may also include fabricating a magnetoresistive random-access memory (MRAM) trench independently from fabricating the logic trench and the logic via. The MRAM trench may land on a hard mask of a magnetic tunnel junction (MTJ) within an MTJ region of the semiconductor device. The method may also include simultaneously filling and polishing the MRAM trench, the logic via, and the logic trench.

A semiconductor device may include a magnetoresistive random-access memory (MRAM) trench having a first conductive barrier liner and a second conductive barrier liner. The MRAM trench may land on a hard mask of a magnetic tunnel junction (MTJ) within an MTJ region of the semiconductor device. The semiconductor device may also include a logic trench having the first conductive barrier liner. The semiconductor device may further include a logic via having the first conductive barrier liner. The logic via may land on a first portion of a means for interconnecting within a logic region of the semiconductor device.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
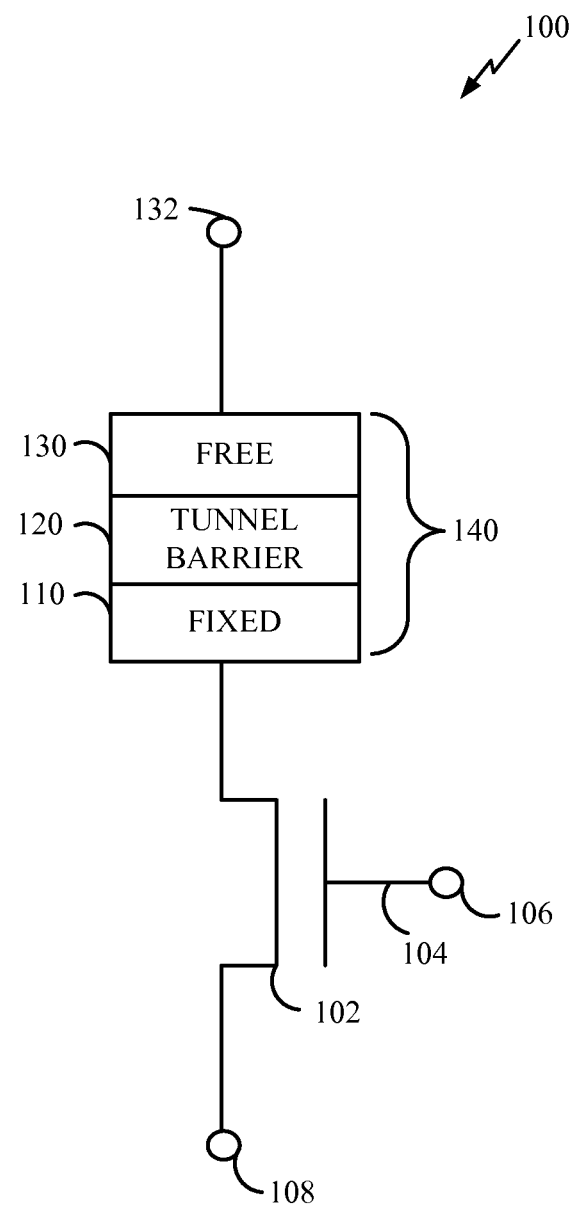
FIG. 1 is a diagram of a magnetic tunnel junction (MTJ) device connected to an access transistor.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Spin transfer torque (STT) efficiency and retention are specified parameters in the design of a magnetic tunnel junction (MTJ) for an embedded STT magnetic random access memory (STT-MRAM). Providing a reliable electrical contact to an active surface of the p-MTJ of the STT-MRAM is a challenging integration problem at advanced logic nodes. In particular, a size of the p-MTJ is substantially reduced in advanced logic nodes. In addition, a via height in standard logic BEOL is also shrinking in proportion with the critical dimension. The reduced size of the MTJ complicates electrical contact during, for example, a back-end-of-line (BEOL) process.

Reliable electrical contact to the MTJ may be provided through a conductive hard mask that is disposed on top of a sidewall angled MTJ. Rather than exhibiting a pillar shape, however, the conductive hard mask is also sidewall angled (e.g., dome shaped). Furthermore, the height of the sidewall angled MTJ and the conductive hard mask is reduced with a critical dimension due to the etched, MTJ sidewall angle. This reduced height results in a smaller margin between contacting the conductive hard mask and shorting the MTJ. As a result, contacting of the MTJ is conventionally performed by introducing a cap structure or a via structure or both to improve process margin. Using a cap to contact the active surface of the p-MTJ, however, involves an additional, potentially critical mask.

Various aspects of the disclosure provide techniques improving a process margin for contacting an active surface of a magnetic tunnel junction (MTJ), while preserving the standard logic low-dielectric constant (k) BEOL process. The process flow for contacting the active surface of the MTJ may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to the substrate of a wafer that is not diced. Similarly, the terms wafer and die may be used interchangeably unless such interchanging would tax credulity.

As described herein, the back-end-of-line interconnect layers may refer to the conductive interconnect layers (e.g., metal one (M1), metal two (M2), metal three (M3), etc.) for electrically coupling to front-end-of-line active devices of an integrated circuit. The back-end-of-line interconnect layers may electrically couple to middle-of-line interconnect layers for connecting M1 to the OD layer of an integrated circuit. A back-end-of-line first via (V1) may connect M1 to M2 or others of the back-end-of-line interconnect layers.

In aspects of the present disclosure, providing reliable electrical contact to a p-MTJ includes separating fabrication of a memory bit line trench from fabrication of an adjacent logic trench. In this aspect of the present disclosure, a memory bit line trench is fabricated prior to fabrication of a logic trench. The memory bit line trench is lined with a first conductive barrier liner. The first conductive barrier liner provides protection during a subsequent fabrication process to form the adjacent logic trench. Fabrication of the memory bit line trench, which is generally uniform (e.g., of a single width and a single space), is separated from fabrication of the adjacent logic trench, which is non-uniform and generally unlimited in possible directions and dimensions.

Separately fabricating the memory bit line trench improves a process margin for contacting an active surface of the magnetic tunnel junction (MTJ), while preserving, for example, a standard logic low-dielectric constant BEOL process. In particular, two distinct trench etch steps are performed to fabricate the memory bit line trench and the adjacent logic trench. In this arrangement, the memory bit line trench is concurrently formed with an edge bit line trench, with each trench lined with the first conductive barrier liner. Following the subsequent fabrication of the logic trench, the logic trench, the memory bit line trench and the edge bit line trench are lined with a second conductive barrier liner. In addition, a separate landing is provided for a memory array edge via and a general logic via.

FIG. 1 illustrates a memory cell 100 of a memory device including a magnetic tunnel junction (MTJ) 140 coupled to an access transistor 102. The memory device may be a magnetic random access memory (MRAM) device that is built from an array of individually addressable MTJs. An MTJ stack may include a free layer, a fixed layer and a tunnel barrier layer there between as well as one or more ferromagnetic (or anti-ferromagnetic) layers. Representatively, a free layer 130 of the MTJ 140 is coupled to a bit line 132. The access transistor 102 is coupled between a fixed layer 110 of the MTJ 140 and a fixed potential node 108. A tunnel barrier layer 120 is coupled between the fixed layer 110 and the free layer 130. The access transistor 102 includes a gate 104 coupled to a word line 106.

Synthetic anti-ferromagnetic materials may form the fixed layer 110 and the free layer 130. For example, the fixed layer 110 may comprise multiple material layers including a cobalt-iron-boron (CoFeB) layer, a ruthenium (Ru) layer and a cobalt-iron (CoFe) layer. In addition, the free layer 130 may also include multiple material layers including a cobalt-iron-boron (CoFeB) layer, a ruthenium (Ru) layer and a cobalt-iron (CoFe) layer. Further, the tunnel barrier layer 120 may be magnesium oxide (MgO).

Figure 2:
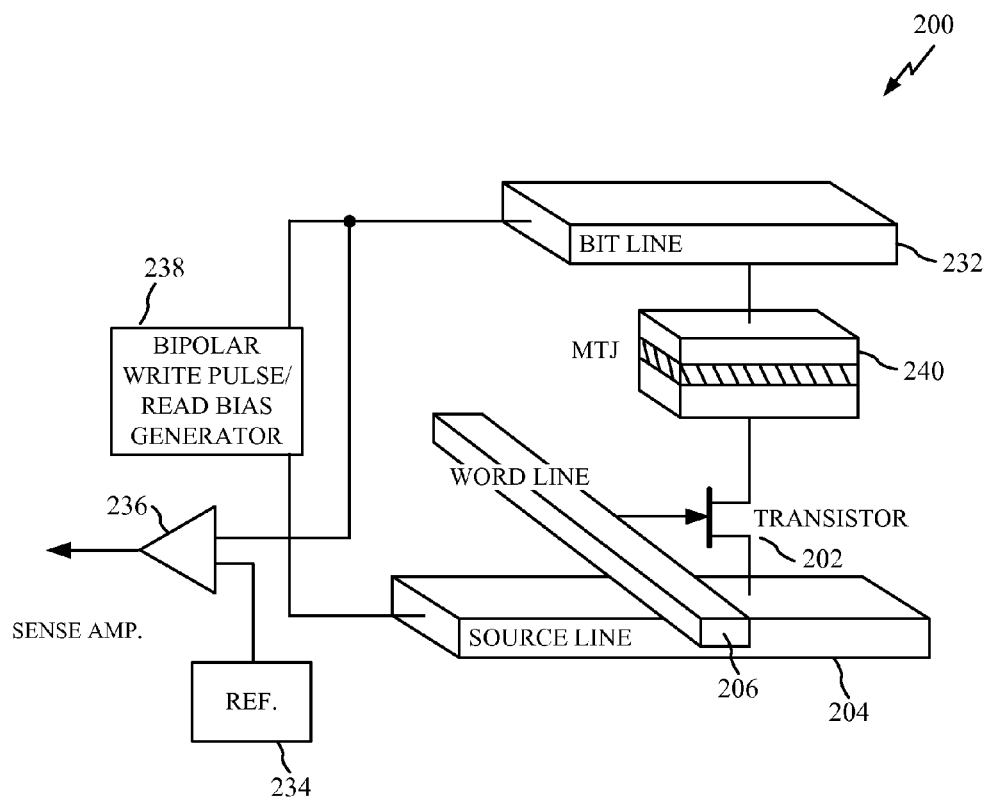
FIG. 2 is a conceptual diagram of a conventional magnetic random access memory (MRAM) cell including an MTJ.

FIG. 2 illustrates a conventional STT-MRAM bit cell 200. The STT-MRAM bit cell 200 includes a magnetic tunnel junction (MTJ) storage element 240, a transistor 202, a bit line 232 and a word line 206. The MTJ storage element 240 is formed, for example, from at least two anti-ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned or opposite. The resistance of the electrical path through the MTJ varies depending on the alignment of the polarizations of the pinned and free layers. This variance in resistance may program and read the bit cell 200. The STT-MRAM bit cell 200 also includes a source line 208, a sense amplifier 236, read/write circuitry 238 and a bit line reference 234

Magnetic Random Access Memory

Materials that form a magnetic tunnel junction (MTJ) of an MRAM generally exhibit high tunneling magneto resistance (TMR), high perpendicular magnetic anisotropy (PMA) and good data retention. MTJ structures may be made in a perpendicular orientation, referred to as perpendicular magnetic tunnel junction (pMTJ) devices. A stack of materials (e.g., cobalt-iron-boron (CoFeB) materials) with a dielectric barrier layer (e.g., magnesium oxide (MgO)) may be employed in a pMTJ structure. A pMTJ structure including a stack of materials (e.g., CoFeB/MgO/CoFeB) has been considered for MRAM structures.

Figure 3:
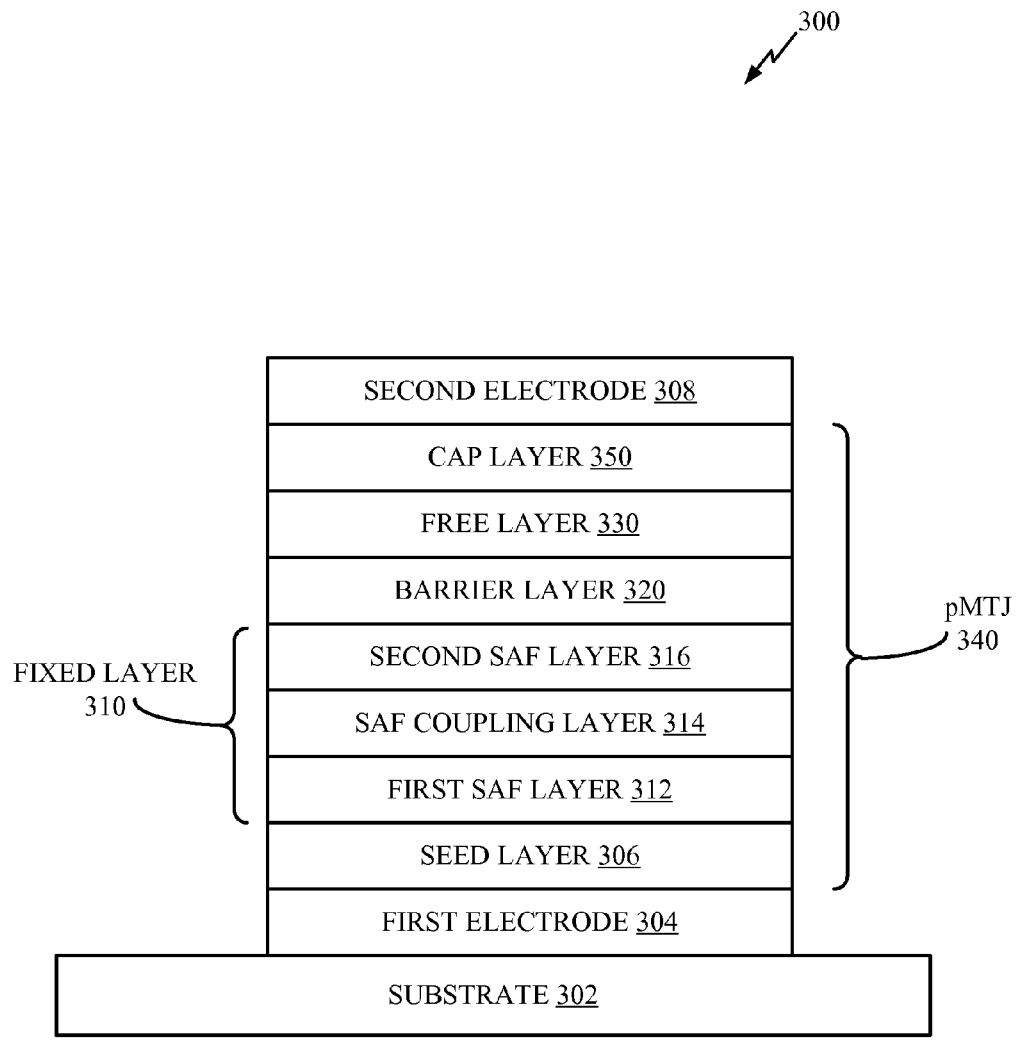
FIG. 3 is a cross-sectional diagram illustrating a conventional perpendicular magnetic tunnel junction (pMTJ) structure.

FIG. 3 illustrates a cross-sectional view of a conventional perpendicular magnetic tunnel junction (pMTJ) structure. Representatively, an MTJ structure 300, which is shown as a pMTJ structure 340 in FIG. 3, is formed on a substrate 302. The MTJ structure 300 may be formed on a semiconductor substrate, such as a silicon substrate, or any other alternative suitable substrate material. The MTJ structure 300 may include a first electrode 304, a seed layer 306, and a fixed layer 310. The fixed layer 310 includes a first synthetic antiferromagnetic (SAF) layer 312, a SAF coupling layer 314, and a second SAF layer 316. The MTJ structure 300 also includes a barrier layer 320, a free layer 330, a cap layer 350 (also known as a capping layer), and a second electrode 308. The MTJ structure 300 may be a part of various types of devices, such as a semiconductor memory device (e.g., MRAM).

In this configuration, the first electrode 304 and the second electrode 308 include conductive materials (e.g., tantalum (Ta)). In other configurations, the first electrode 304 and/or second electrode 308 may include other appropriate materials, including but not limited to platinum (Pt), copper (Cu), gold (Au), aluminum (Al), or other like conductive materials. The first electrode 304 and the second electrode 308 may employ different materials within the MTJ structure 300.

A seed layer 306 is formed on the first electrode 304. The seed layer 306 may provide a mechanical and crystalline substrate for the first SAF layer 312. The seed layer 306 may be a compound material, including but not limited to, nickel chromium (NiCr), nickel iron (NiFe), NiFeCr, or other suitable materials for the seed layer 306. When the seed layer 306 is grown or otherwise coupled to the first electrode 304, a smooth and dense crystalline structure results in the seed layer 306. In this configuration, the seed layer 306 promotes growth of subsequently formed layers in the MTJ structure 300 according to a specific crystalline orientation. The crystalline structure of the seed layer 306 may be selected to be any crystal orientation within the Miller index notation system, but is often chosen to be in the (111) crystal orientation.

A first SAF layer 312 is formed on the seed layer 306. The first SAF layer 312 includes a multilayer stack of materials formed on the seed layer 306, which may be referred to herein as a first anti-parallel pinned layer (AP1). The multilayer stack of materials in the first SAF layer 312 may be an anti-ferromagnetic material or a combination of materials to create an anti-ferromagnetic moment in the first SAF layer 312. The multilayer stack of materials forming the first SAF layer 312 include, but are not limited to, cobalt (Co), cobalt in combination with other materials such as nickel (Ni), platinum (Pt), or palladium (Pd), or other like ferromagnetic materials.

An SAF coupling layer 314 is formed on the first SAF layer 312, and promotes magnetic coupling between the first SAF layer 312 and a second SAF layer 316. The second SAF layer 316 has a magnetic orientation anti-parallel with the first SAF layer 312. The SAF coupling layer 314 includes material that aides in this coupling including, but not limited to, ruthenium (Ru), tantalum (Ta), gadolinium (Gd), platinum (Pt), hafnium (Hf), osmium (Os), rhodium (Rh), niobium (Nb), terbium (Tb), or other like materials. The SAF coupling layer 314 may also include materials to provide mechanical and/or crystalline structural support for the first SAF layer 312 and the second SAF layer 316.

The second SAF layer 316 is formed on the SAF coupling layer 314. The second SAF layer 316 may have similar materials as the first SAF layer 312, but may include other materials. The combination of the first SAF layer 312, the SAF coupling layer 313, and the second SAF layer 316 forms the fixed layer 310 including the SAF reference layers, which is often referred to as a "pinned layer" in the MTJ structure 300. The fixed layer 310 fixes, or pins, the magnetization direction of the SAF reference layers (e.g., 312, 314, 316) through anti-ferromagnetic coupling. As described herein, the second SAF layer 316 may be referred to as a second anti-parallel pinned layer (AP2). In this arrangement, the first SAF layer 312 may be referred to as a first anti-parallel pinned layer (AP1) that is separated from the second anti-parallel pinned layer (AP2) by the SAF coupling layer 314 to form the fixed layer 310. The fixed layer 310 may include a cobalt-iron-boron (CoFeB) film. The fixed layer 310 may also include other ferromagnetic material layers, such as CoFeTa, NiFe, Co, CoFe, CoPt, CoPd, FePt, or any alloy of Ni, Co and Fe.

A TMR enhancement layer of the fixed layer 310 abutting the barrier layer 320 may be formed of a material, such as CoFeB, that provides a crystalline orientation for the barrier layer 320. As with the seed layer 306, the material in the fixed layer 310 provides a template for subsequent layers to be grown in a specific crystalline orientation. This orientation may be in any direction within the Miller index system, but is often in the (100) (or (001)) crystal orientation.

The barrier layer 320 (also referred to as a tunnel barrier layer) is formed on the fixed layer 310. The barrier layer 320 provides a tunnel barrier for electrons travelling between the fixed layer 310 and the free layer 330. The barrier layer 320, which may include magnesium oxide (MgO), is formed on the fixed layer 310 and may have a crystalline structure. The crystalline structure of the barrier layer 320 may be in the (100) direction. The barrier layer 320 may include other elements or other materials, such as aluminum oxide (AlO), aluminum nitride (AlN), aluminum oxynitride (AlON), or other non-magnetic or dielectric material. The thickness of the barrier layer 320 is selected so that electrons can tunnel from the fixed layer 310 through the barrier layer 320 to the free layer 330 when a biasing voltage is applied to the MTJ structure 300.

The free layer 330, which may be cobalt-iron-boron (CoFeB), is formed on the barrier layer 320. The free layer 330, when initially deposited on the barrier layer 320, is an amorphous structure. That is, the free layer 330 does not have a crystalline structure when initially deposited on the barrier layer 320. The free layer 330 is also an anti-ferromagnetic layer or multilayer material, which may include similar anti-ferromagnetic materials as the fixed layer 310 or may include different materials.

In this configuration, the free layer 330 includes an anti-ferromagnetic material that is not fixed or pinned in a specific magnetic orientation. The magnetization orientation of the free layer 330 is able to rotate to be in a parallel or an anti-parallel direction to the pinned magnetization of the fixed layer 310. A tunneling current flows perpendicularly through the barrier layer 320 depending upon the relative magnetization directions of the fixed layer 310 and the free layer 330.

A cap layer 350 is formed on the free layer 330. The cap layer 350 may be a dielectric layer, or other insulating layer, to allow containment of the magnetic and electric fields between the free layer 330 and the fixed layer 310. The cap layer 350 helps reduce the switching current density that switches the MTJ structure 300 from one orientation (e.g., parallel) to the other (e.g., anti-parallel). The cap layer 350, which may also be referred to as a capping layer, may be an oxide, such as, for example, amorphous aluminum oxide (AlOx) or amorphous hafnium oxide (HfOx). The cap layer 350 may also be other materials, such as magnesium oxide (MgO) or other dielectric materials without departing from the scope of the present disclosure.

The second electrode 308 is formed on the cap layer 350. In one configuration, the second electrode 308 includes tantalum. Alternatively, the second electrode 308 includes any other suitable conductive material for electrical connection of the MTJ structure 300 to other devices or portions of a circuit. Formation of the second electrode 308 on the cap layer 350 completes the MTJ structure 300.

Figure 4A:
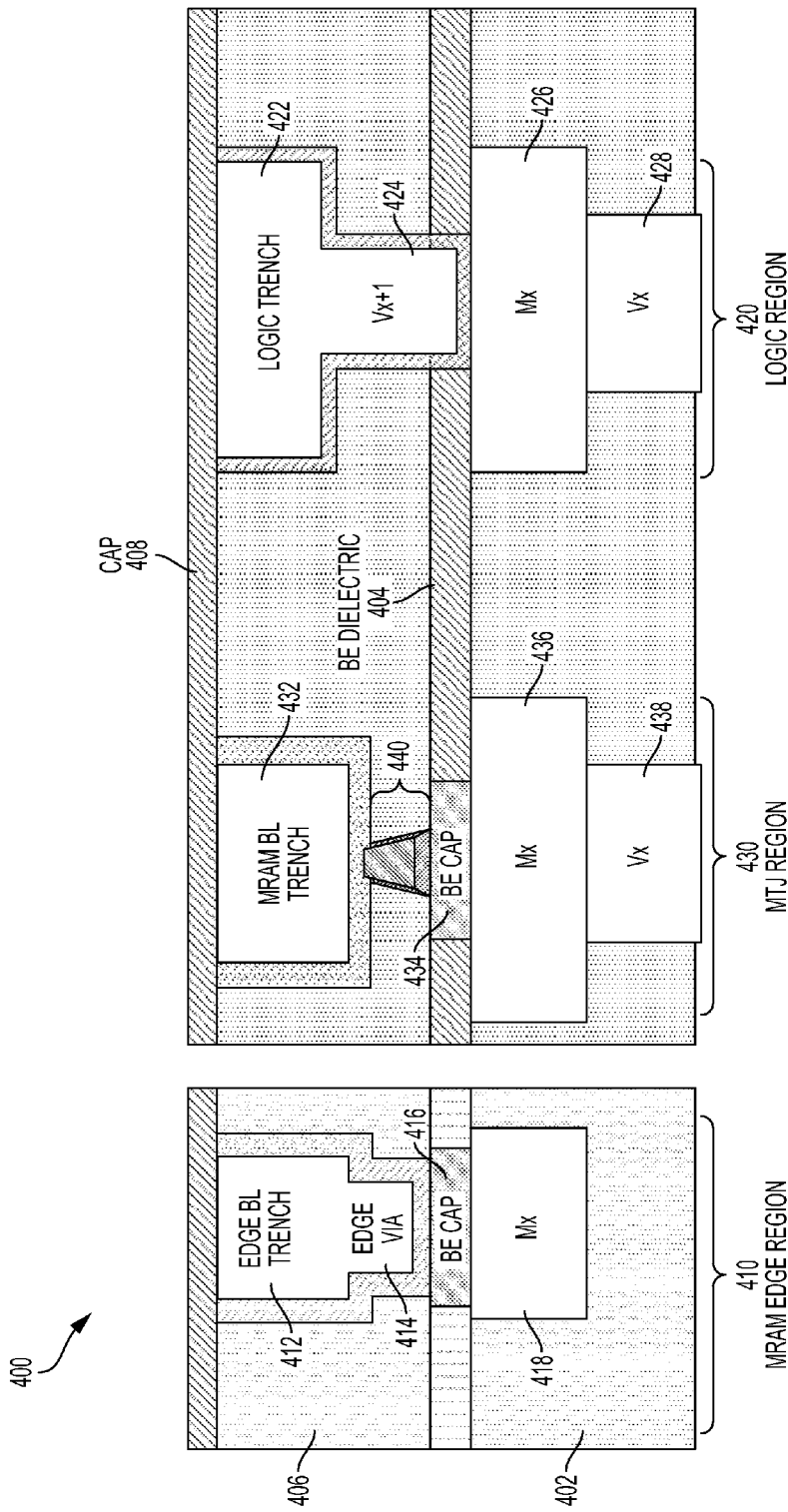
FIGS. 4A and 4B illustrate a cross-sectional view and a top view of a semiconductor device that includes a memory edge region, a magnetic tunnel junction (MTJ) region and a logic region.

FIG. 4A illustrates a cross-sectional view of a semiconductor device 400 that includes a memory edge region 410 (e.g., magnetic random access memory (MRAM)), a magnetic tunnel junction (MTJ) region 430 and a logic region 420. The memory edge region 410 includes a first conductive interconnect (Mx) 418 within a first dielectric layer 402. A first bottom electrode cap 416 provides electrical contact between the first conductive interconnect 418 (Mx) and an edge bit line trench 412 through an edge via 414 within a second dielectric layer 406. The logic region 420 includes a second conductive interconnect 426 (Mx) on a via 428 (Vx) within the first dielectric layer 402. A logic via 424 (Vx+1) provides electrical contact between the second conductive interconnect 426 (Mx) and a logic trench 422 through a bottom electrode dielectric 404 separating the first dielectric layer 402 from the second dielectric layer 406.

In this arrangement, the MTJ region 430 includes a third conductive interconnect 436 (Mx) on an MTJ via 438 (Vx) within the first dielectric layer 402. An MTJ 440 is supported by a second bottom electrode cap 434 that provides electrical contact to the MTJ via 438 (Vx) through the third conductive interconnect 436 (Mx). A memory bit line trench 432 may contact an active surface of the MTJ 440. A capping layer 408 is disposed on the edge bit line trench 412, the memory bit line trench 432, and the logic trench 422.

Figure 4B:
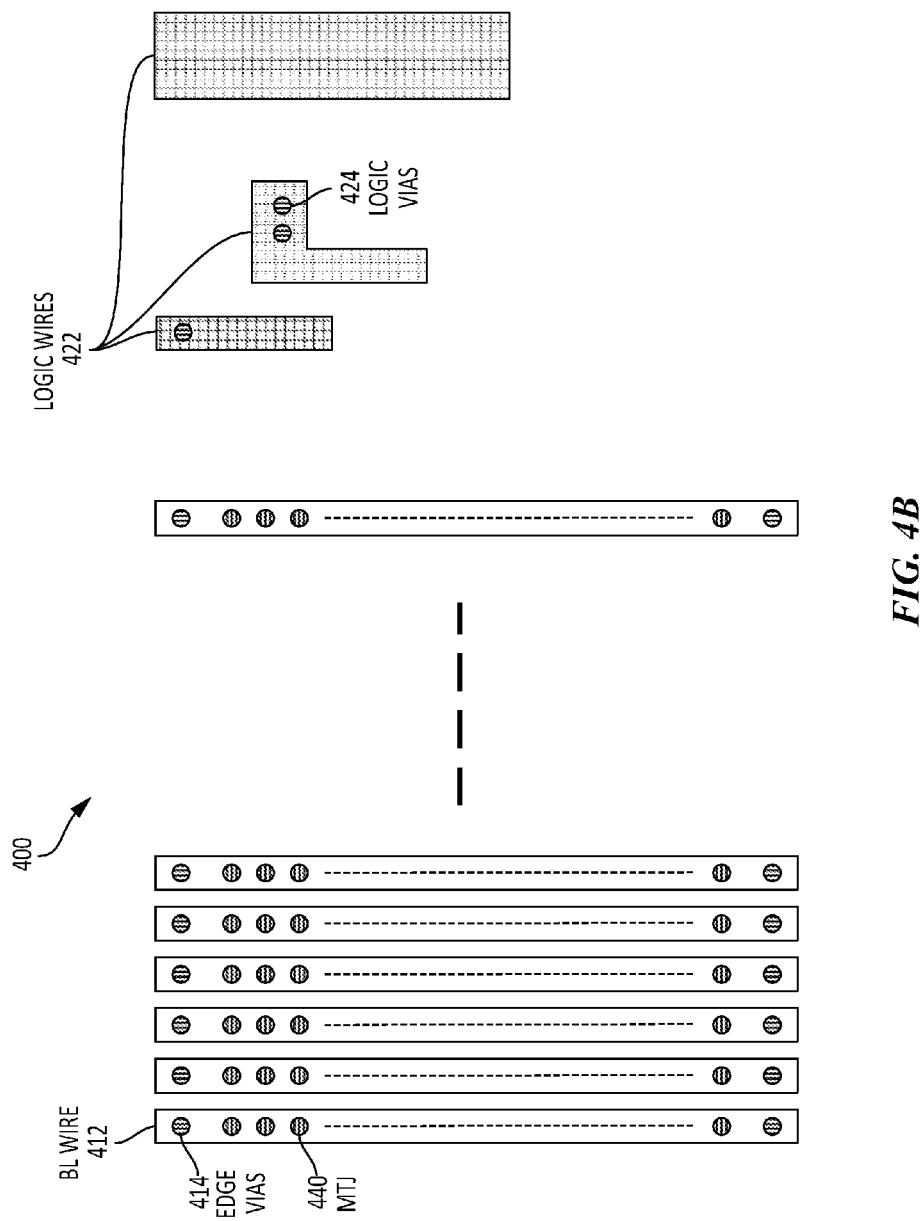

FIG. 4B illustrates a top view of the semiconductor device 400 arranged as a memory array including multiple bit line (BL) wires. In this arrangement, the edge bit line trench 412 (e.g., BL wire) is shown with reference to multiple ones of the edge via 414 and the MTJ 440. In addition, the logic trench 422 (e.g., logic wires) is shown with reference to multiple ones of the logic vias 424. Representatively, each BL wire (e.g., 412) is electrically coupled to multiple MTJs 440. Each BL wire (e.g., 412) is also electrically coupled to an edge via 414 for enabling control of read/write operation to/from the memory array.

Referring again to FIG. 4A, fabrication of the memory bit line trench 432 is generally uniform (e.g., of a single width and a single space) according to the corresponding uniform distribution of the MTJ 440. By contrast, fabrication of the logic trench 422 is non-uniform and generally unlimited in possible directions and dimensions, as shown in FIG. 4B. In conventional fabrication processes, however, the memory bit line trench 432 and the logic trench 422 are concurrently formed in spite of their divergent characteristics. Concurrent formation of the memory bit line trench 432 and the logic trench 422 inhibits reliable electrical contact between the memory bit line trench 432 and the MTJ 440.

One technique for providing electrical contact between the memory bit line trench 432 and the MTJ 440 relies on a cap. Using a cap for providing electrical contact to the MTJ 440, however, involves an additional mask to fabricate the cap. That is, an additional mask to fabricate the cap is generally incurred because the memory bit line trench 432 and the logic trench 422 are concurrently formed.

Figure 5A:
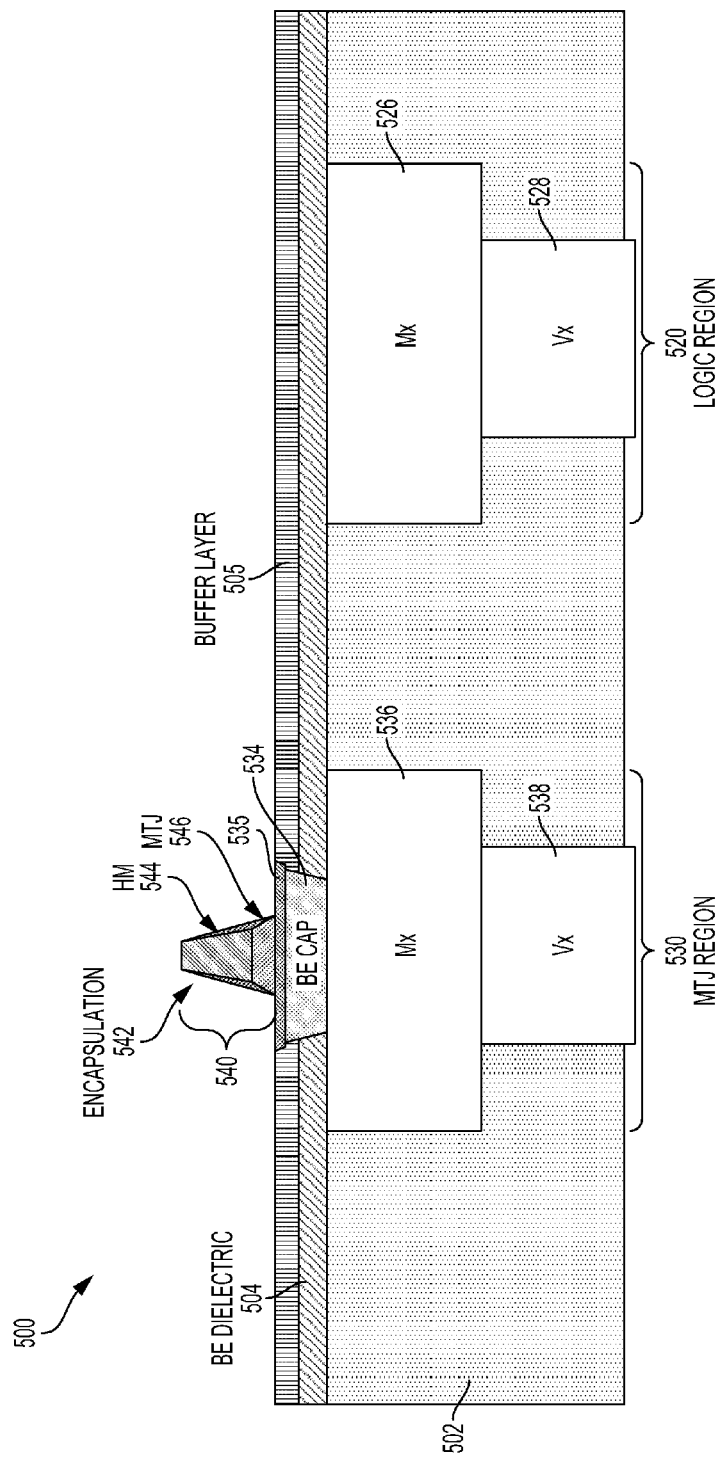
FIGS. 5A-5Q illustrate a semiconductor device at various stages of fabrication in which fabrication of a memory bit line trench is separated from fabrication of an adjacent logic trench in accordance with aspects of the present disclosure.

In aspects of the present disclosure, providing reliable electrical contact to an MTJ includes separating fabrication of a memory bit line trench from fabrication of an adjacent logic trench. FIGS. 5A-5Q illustrate a semiconductor device 500 at various stages of fabrication in which fabrication of a memory bit line trench is separated from fabrication of an adjacent logic trench in accordance with aspects of the present disclosure. For example, FIGS. 5A-5Q illustrate a sequential fabrication approach for the semiconductor device 600 shown in FIG. 6.

Figure 6:
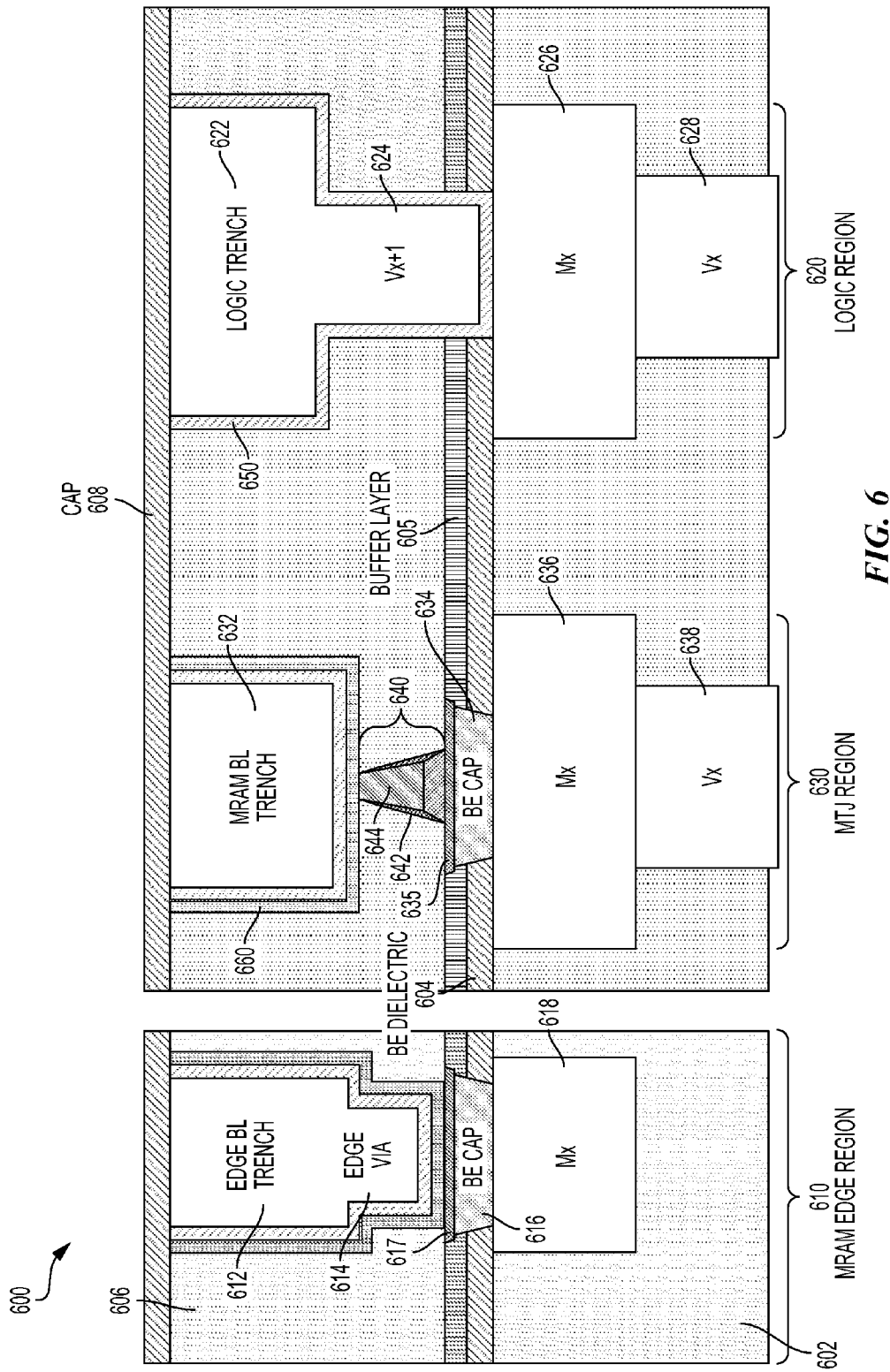
FIG. 6 illustrate a semiconductor device in which fabrication of a memory bit line trench is separated from fabrication of an adjacent logic trench in accordance with aspects of the present disclosure.

As shown in FIG. 6, a memory bit line trench 632 is fabricated prior to fabrication of a logic trench 622 in which the memory bit line trench 632 is lined with a second conductive barrier liner 660. The second conductive barrier liner 660 provides protection for the memory bit line trench 632 during a subsequent fabrication process to form the logic trench 622 adjacent to the memory bit line trench 632. A first conductive barrier liner 650 (e.g., a Cu barrier metal) is deposited on the second conductive barrier liner 660 after fabrication of the logic trench 622. That is, fabrication of the memory bit line trench 632, which is generally uniform (e.g., of a single width and a single space), is separated from fabrication of the logic trench 622, which is non-uniform and generally unlimited in possible directions and dimensions.

FIG. 5A illustrates a cross-sectional view of a semiconductor device 500 that includes a magnetic tunnel junction (MTJ) region 530 and a logic region 520. The logic region 520 includes a second conductive interconnect 526 (Mx) on a via 528 (Vx) within a first dielectric layer 502. The MTJ region 530 includes a third conductive interconnect 536 (Mx) on an MTJ via 538 (Vx) within the first dielectric layer 502. An MTJ 540 is supported by a second bottom electrode cap 534 and a bottom electrode contact 535 that provides electrical contact to the MTJ via 538 (Vx) through the third conductive interconnect 536 (Mx).

In this arrangement, the MTJ 540 includes an MTJ stack 546 supported by the bottom electrode contact 535 and a hard mask on the MTJ stack 546. The MTJ 540 may be fabricated by forming the second bottom electrode cap 534 (e.g., tantalum nitride (TaN)) and the bottom electrode contact 535 on the second bottom electrode cap 534 within the BE dielectric layer 504 and the buffer layer 505 of the MTJ region 530. An MTJ stack 546 is then fabricated by depositing an MTJ thin film stack, for example, as described in FIG. 3. A conductive hard mask 544 (e.g., titanium nitride (TiN), tantalum (Ta)) is deposited on the MTJ stack 546. Once deposited, an MTJ lithography and hard mask etch are performed. Formation of the MTJ 540 is completed following deposition of a passivation layer (e.g., a 10 to 20 nanometer dielectric layer) and etch back to form an encapsulation layer 542 (e.g., silicon nitride (SiNx)) on sidewalls of the MTJ 540.

As shown in FIG. 5A, the MTJ lithography and hard mask etch provide the MTJ 540 with a non-uniform shape (e.g., a dome shape). That is, etching of the MTJ stack 546 and the conductive hard mask 544 of the MTJ 540 results in a sidewall angled MTJ (e.g., a 70° to 80° sidewall angle). Unfortunately, providing reliable electrical contact to the MTJ 540 through the conductive hard mask 544 that is disposed on the sidewall angled MTJ is challenging. In particular, rather than exhibiting a pillar shape with a vertical sidewall, the conductive hard mask 544 is also sidewall angled (e.g., dome shaped), which reduces a size of the active surface of the conductive hard mask 544.

Furthermore, the height of the MTJ stack 546 and the conductive hard mask 544 is reduced with a critical dimension due to the sidewall angle of the MTJ 540. This reduced height results in a smaller margin between contacting the conductive hard mask 544 and shorting the MTJ 540. As a result, contacting of the MTJ 540 is conventionally performed by introducing a cap. Using a cap to contact the active surface of the MTJ 540, however, involves an additional, potentially critical mask. Using a cap also have potential impact on inter-level dielectric properties and may lead to additional performance loss and/or power consumption for the semiconductor product. As described in further detail below, a memory bit line trench 532 is formed separately from a logic trench 522 to provide reliable electrical contact to an MTJ 540 using a multiple layers of a conductive barrier liner.

Figure 5B:
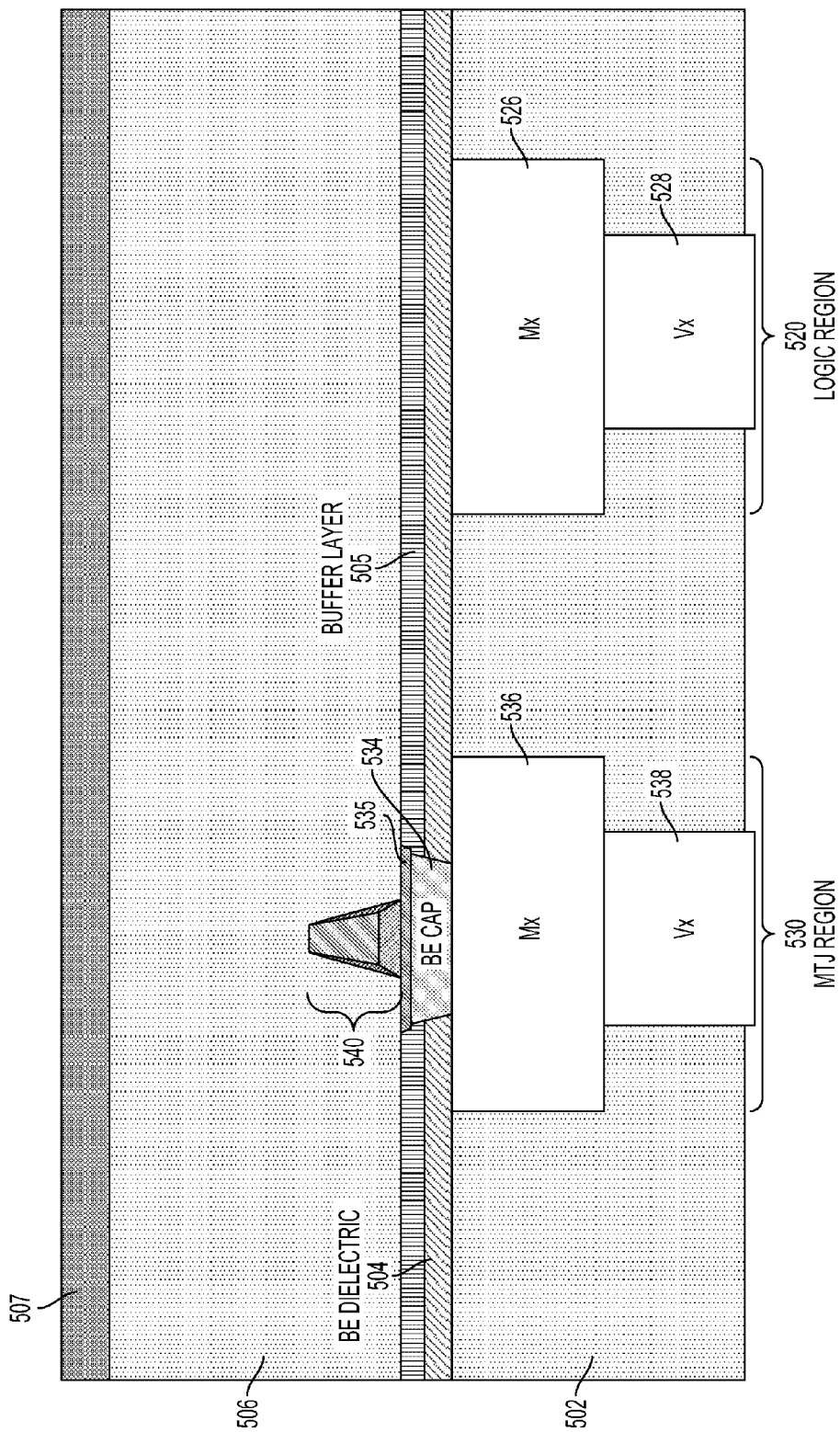

FIG. 5B illustrates a dielectric fill and planarization process following fabrication of the MTJ 540 according to aspects of the present disclosure. Representatively, a second dielectric layer 506 is deposited on the buffer layer 505 and the MTJ 540. The second dielectric layer 506 may be form by deposition of a low dielectric constant (LK) material to a predetermined height (e.g., 250 to 300 nanometers as required to form the next conductive interconnect layer). Once deposited, a chemical mechanical polish (CMP) or other known planarization methods can be used to form a flat surface at the predetermined height. Following the planarization, a first hard mask layer 507 (e.g., TiN) is deposited on the second dielectric layer 506 to a predetermined height (e.g., 30 nanometers).

Figure 5C:
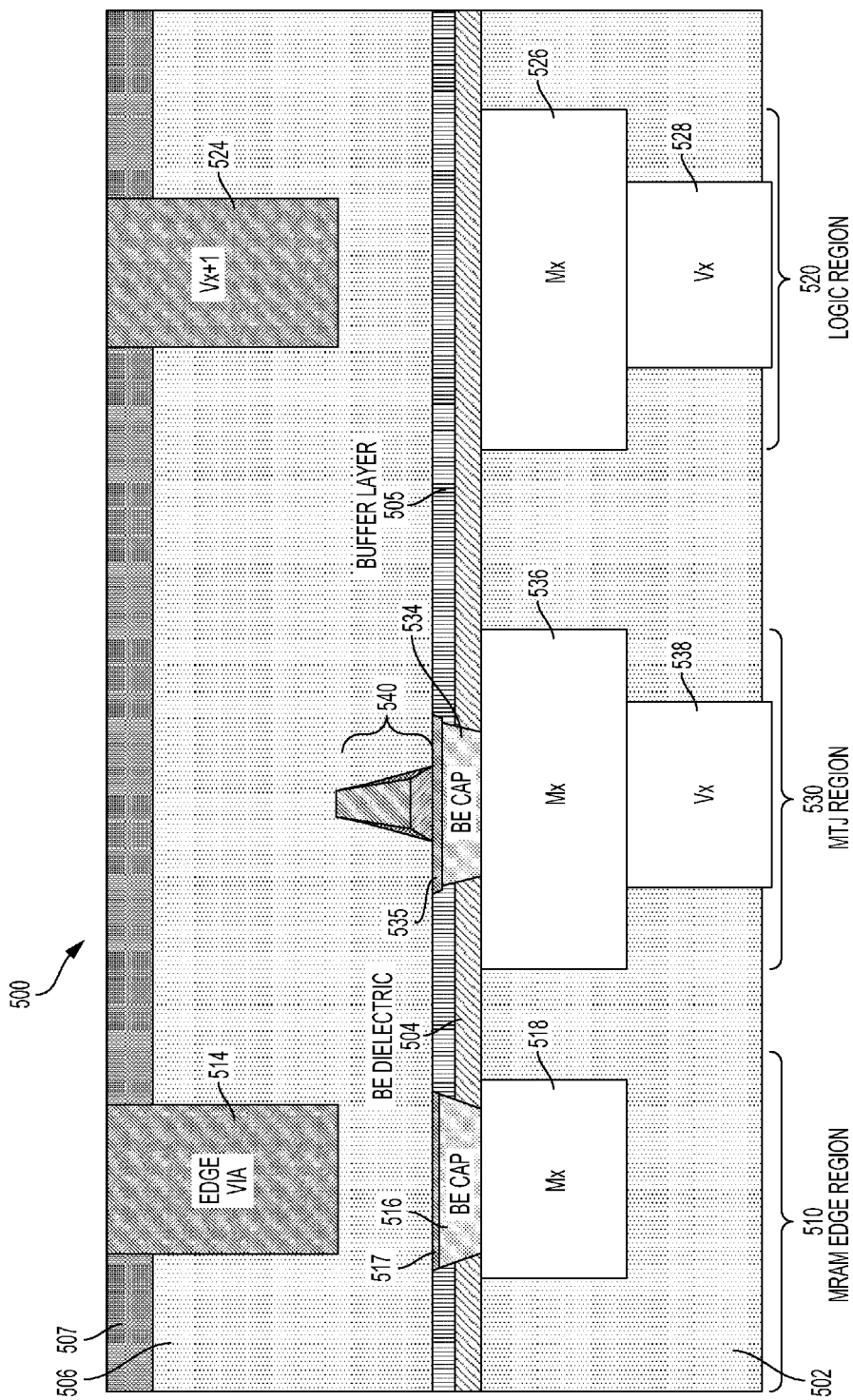

FIG. 5C illustrates a cross-sectional view of the semiconductor device 500 including a memory edge region 510 (e.g., magnetic random access memory (MRAM) edge region), the MTJ region 530 and the logic region 520. The memory edge region 510 includes a first conductive interconnect (Mx) 518 within the first dielectric layer 502. A first bottom electrode cap 516 provides electrical contact between the first conductive interconnect 518 (Mx) and a bottom electrode contact 517 (e.g., an MRAM bottom electrode contact (BEC) structure). In this aspect of the present disclosure, a lithographic process is performed to define an edge via 514 and a logic via 524 (Vx+1). An etch process to form holes for the edge via 514 and the logic via 524 is then performed to a partial depth, for example, half way into the dielectric. The holes for the edge via 514 and the logic via 524 are then filled with, for example, a spin-on material.

Figure 5D:
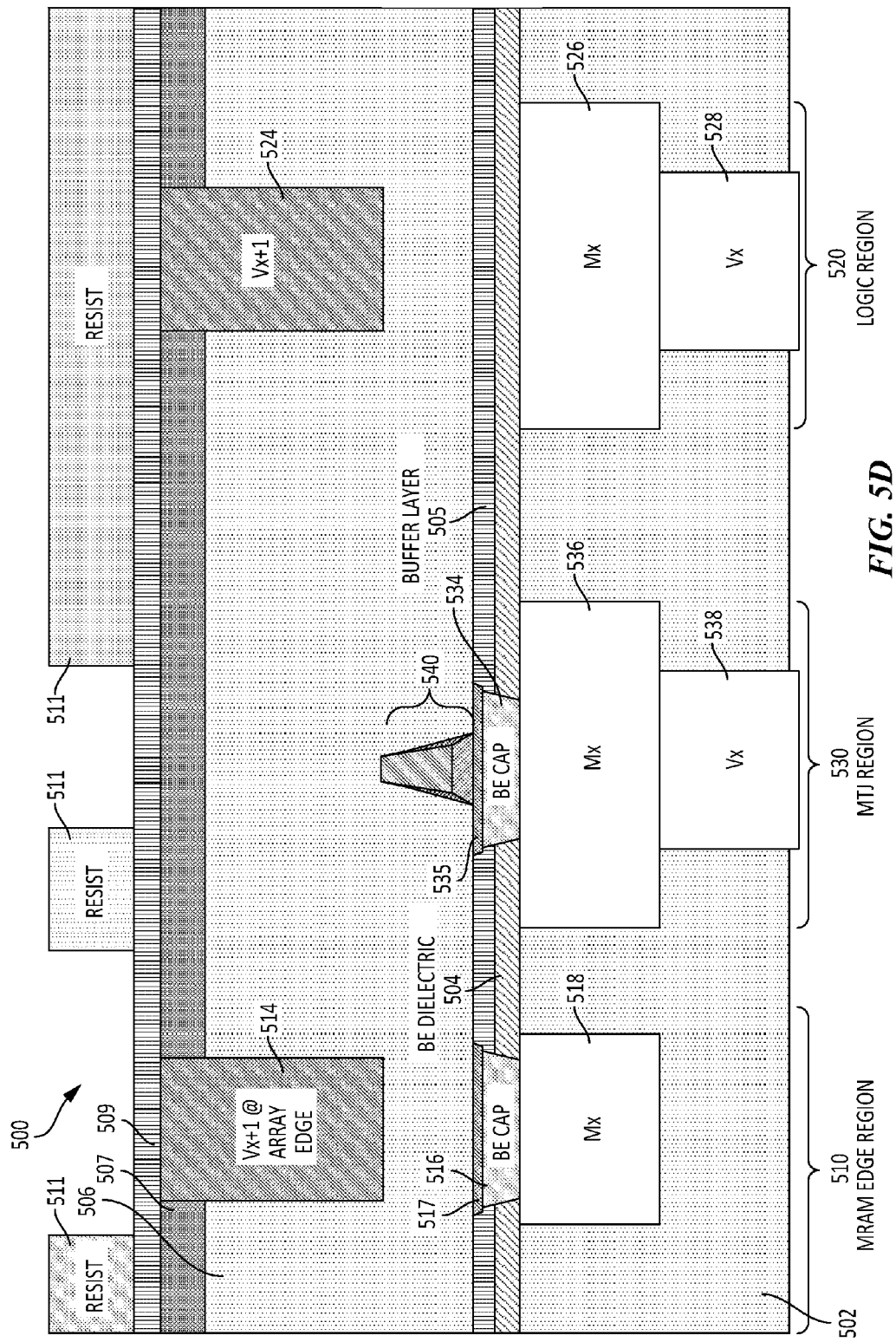

FIG. 5D illustrates a memory bit line lithographic process following fabrication of the edge via 514 and the logic via 524 according to aspects of the present disclosure. Representatively, a second hard mask layer 509 (e.g., a low-temperature oxide or nitride) is deposited on the first hard mask layer 507, the edge via 514, and the logic via 524 to a predetermined thickness (e.g., 20 nanometers). A photoresist layer 511 is then formed on the second hard mask layer 509 to define a memory bit line trench, which extends to the memory array edge region 510.

In this arrangement, the second hard mask layer 509 protects the pre-etched via (e.g., the logic via 524) within the logic region 520 during fabrication of the memory bit line trench and the edge trench. In this aspect of the disclosure, fabrication of the memory bit line trench is performed prior to fabrication of a logic trench because: (1) a resistance specification of the memory bit line trench is more relaxed; (2) non-standard layers can be used for the memory bit line trench; and (3) etching of the memory bit line trench involve more stringent control to provide reliable electrical contact to an active surface of the MTJ 540.

Figure 5E:
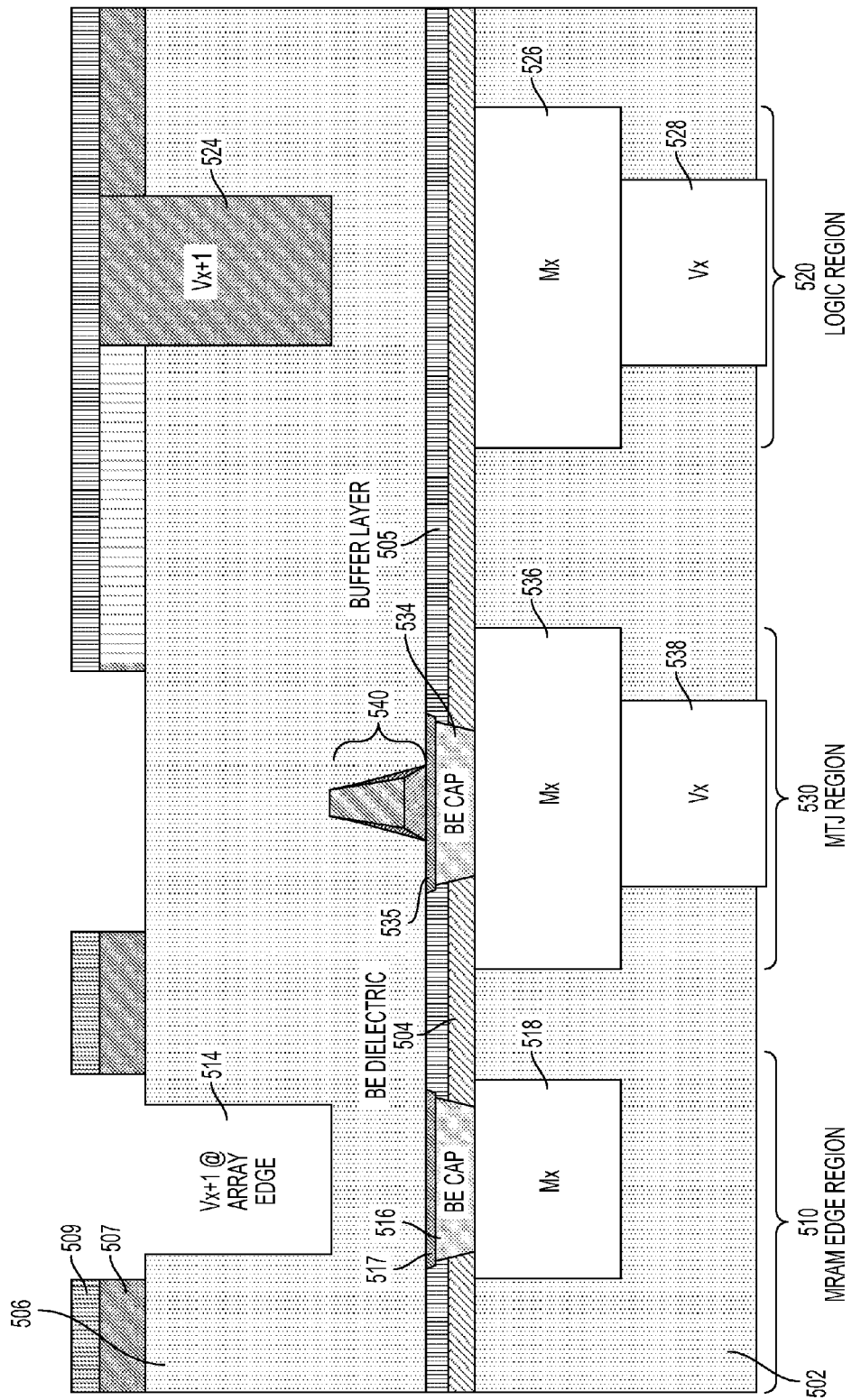

FIG. 5E illustrates a memory bit line hard mask etch process according to aspects of the present disclosure. Representatively, the second hard mask layer 509 is etched and the photoresist layer 511 is stripped to expose portions of the first hard mask layer 507. Next, the first hard mask layer 507 is selectively etched to expose the second dielectric layer 506 in the MTJ region 530. In addition, the selectively etching of the first hard mask layer 507 includes etching of the second dielectric layer 506 and the edge via 514 to open the edge via 514. For example, the edge via 514 may be opened using oxygen plasma (e.g., to remove the organic spin on plug) within the edge via 514. The logic region 520 remains protected by the hard mask layer 509.

Figure 5F:
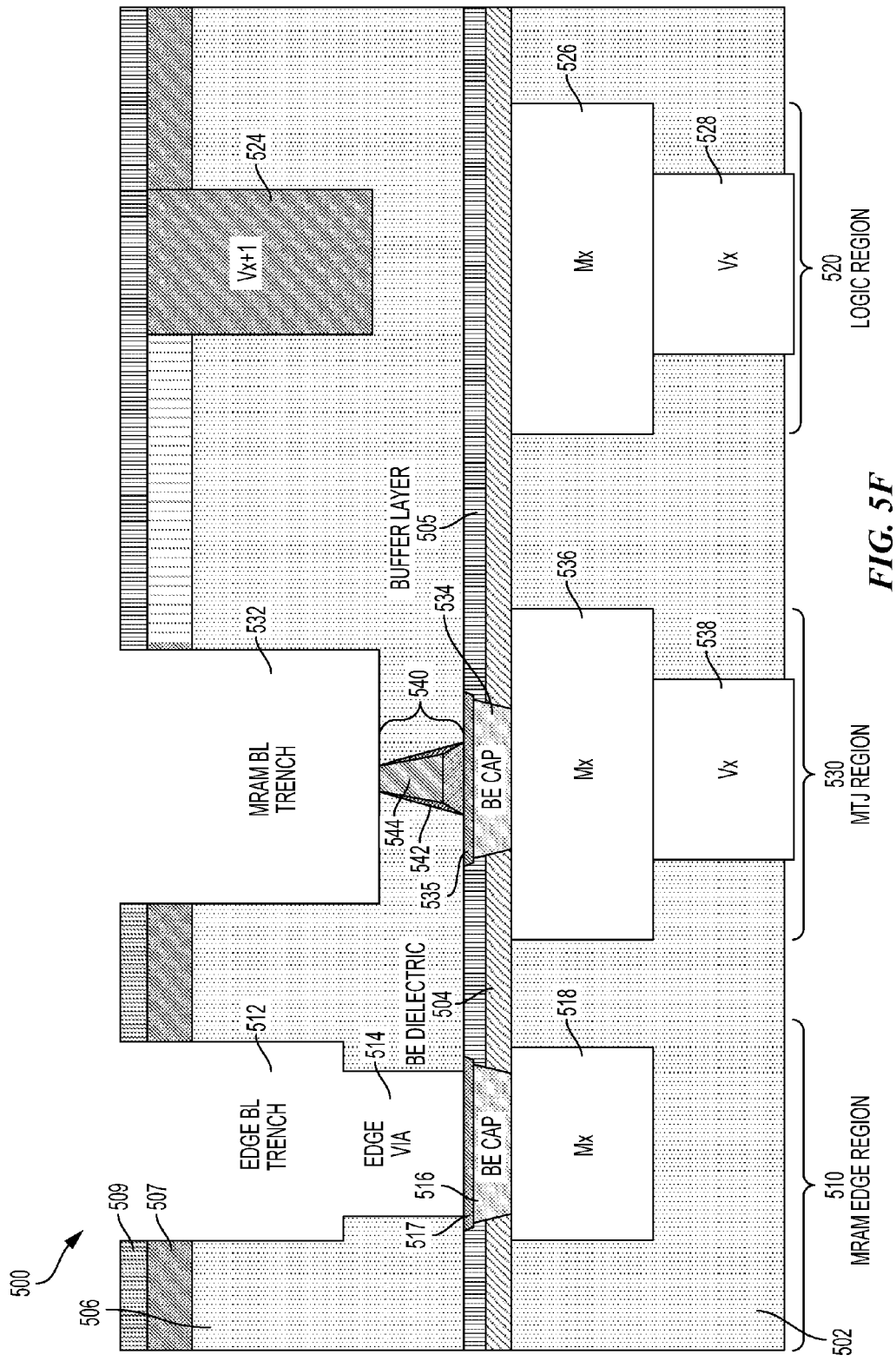

FIG. 5F illustrates a memory bit line etch process according to aspects of the present disclosure. Representatively, the second dielectric layer 506 within the MTJ region 530 is etched to expose the top surface of MTJ 540 (e.g., the conductive hard mask 544 and the encapsulation layer 542). In addition, an edge region of bit line trench 512 is formed within the second dielectric layer 506 to expose the edge via 514. In this arrangement, the edge via 514 lands on the bottom electrode contact 517 (e.g., a bottom electrode contact (BEC)). Landing on the bottom electrode contact 517 avoids punch-through the BE dielectric layer 504 and also reduces an aspect ratio of the edge via 514 to provide improved filling. This bit line etch process has good end point detection. Thus, the etch can land on top of the MTJ 540 with good process margin. Because of the single wire width of the MTJs 540 and simple orientation (and because all bit lines will contact the MTJ 540), it is easier to detect the end point.

Figure 5G:
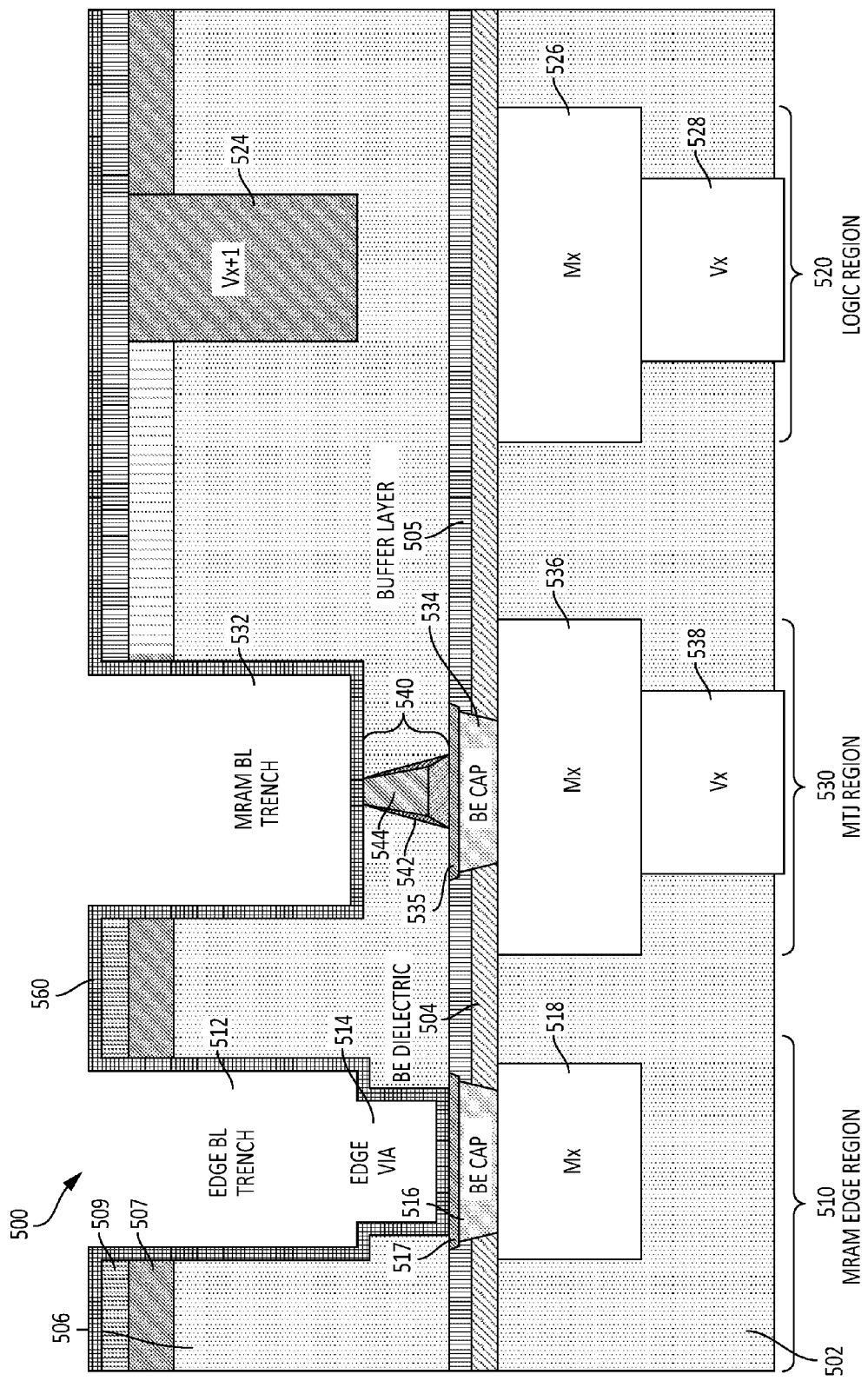

FIG. 5G illustrates a deposition process of a second conductive barrier liner according to aspects of the present disclosure. Representatively, a second conductive barrier liner 560 is deposited on a surface of the second hard mask layer 509 and sidewalls of the first hard mask layer 507 and the second hard mask layer 509. The second conductive barrier liner 560 is also deposited to line the edge of bit line trench 512, the edge via 514, and the memory bit line trench 532. The second conductive barrier liner 560 may include, but is not limited to, tantalum nitride (TaN), ruthenium (Ru), or other materials compatible with dielectric material of layer 506.

In aspects of the present disclosure, the second conductive barrier liner 560 may be a material that provides selectivity during, for example, a fluorine (F)-chemistry dielectric etch. In addition, the second conductive barrier liner 560 may be a material that is resistant to oxidation or in which oxide is easily removed. Furthermore, the second conductive barrier liner 560 may also be a material that is deposited using a low temperature conformal deposition. For example, both a Ru and a Ru titanium nitride (RuTiN) liner may be deposited using a plasma enhanced atomic layer deposition (PEALD). In addition, Ru oxide is a conductor, and Ru is not etched in an F-based reactive ion etching (RIE). Manganese nitride (MnNx) may also be used as the second conductive barrier liner 560 along with a conductive material (e.g., Cu) as a second conductive barrier liner. The second conductive barrier liner 560 protects the memory vias and trenches when later forming the logic circuitry during logic etching.

Figure 5H:
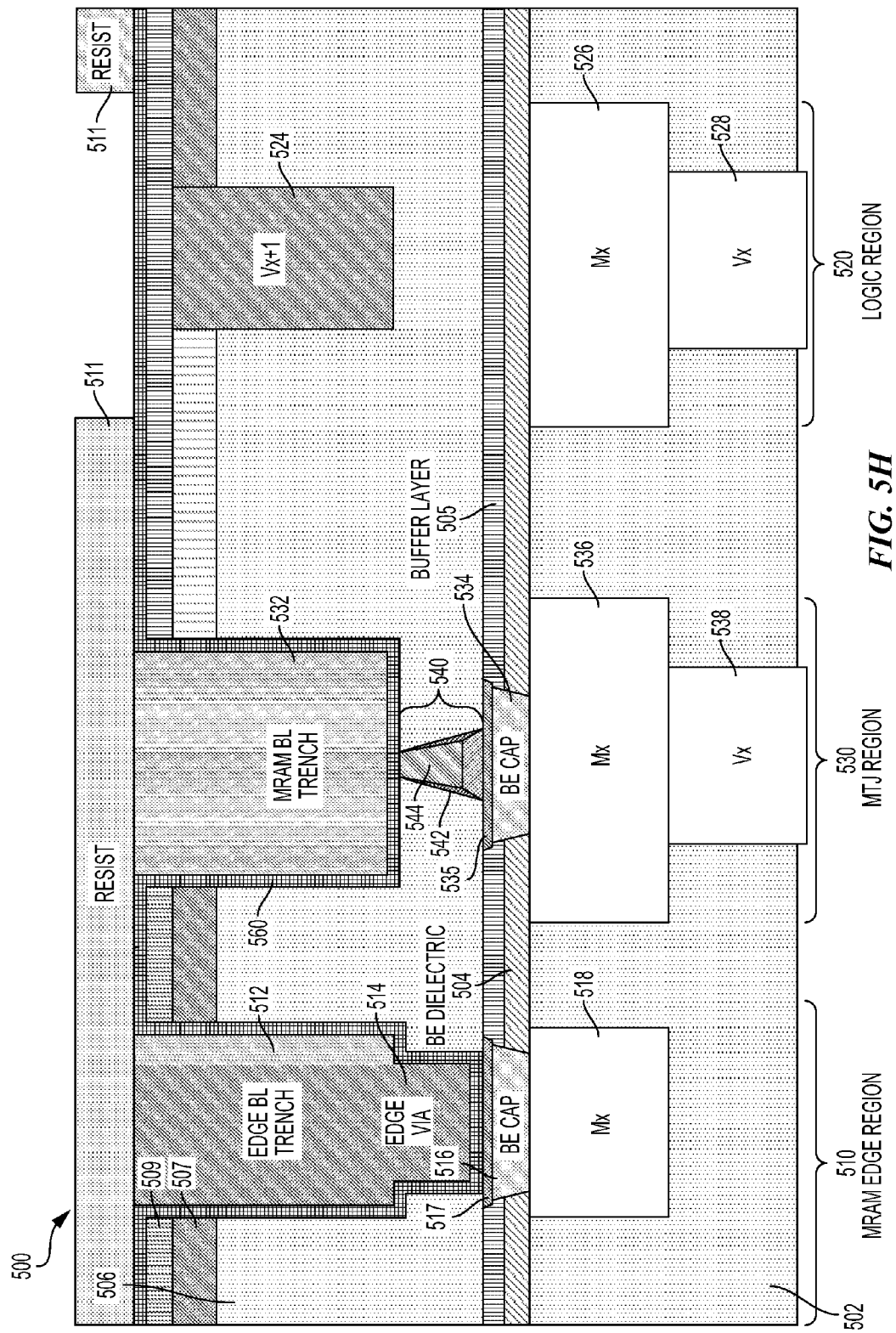

FIG. 5H illustrates a logic trench lithographic process following lining of the edge bit line trench 512 and the memory bit line trench 532 according to aspects of the present disclosure. Representatively, the edge bit line trench 512 and the memory bit line trench 532 are filled with a spin-on material to planarize the wafer. Once filled, the photoresist layer 511 is formed on the second conductive barrier liner 560, the edge bit line trench 512 and the memory bit line trench 532 to define a logic trench.

Figure 5I:
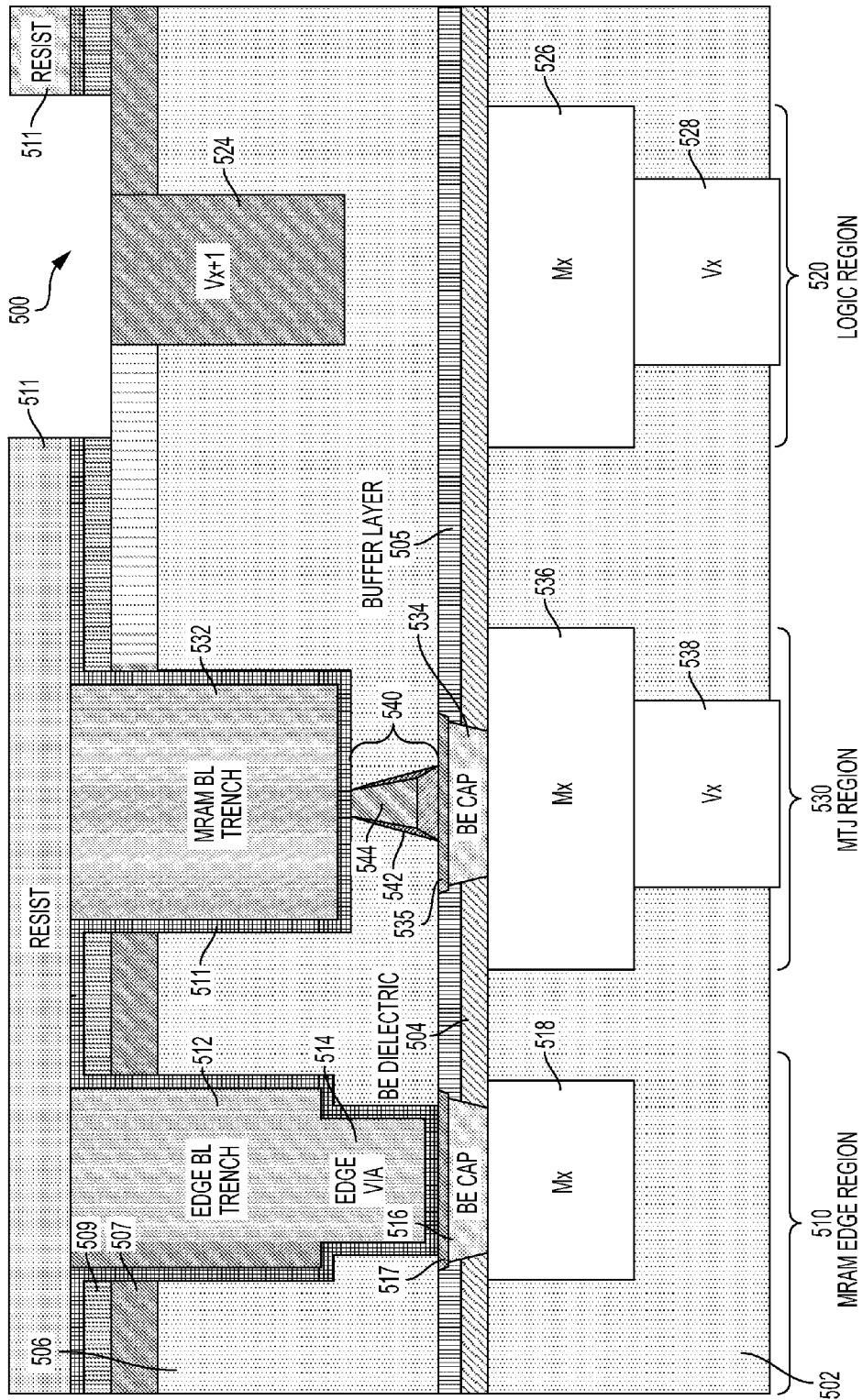

FIG. 5I further illustrates logic trench lithographic processing of FIG. 5H according to aspects of the present disclosure. Representatively, the second conductive barrier liner 560 is etched to expose the second hard mask layer 509. In addition, the second hard mask layer 509 is etched to expose a portion of the first hard mask layer 507 and the logic via 524 within the logic region 520. In this configuration, the second conductive barrier liner 560 may be TaN, and/or other metal such as Ru. In addition, the second hard mask layer 509 may be an oxide layer.

Figure 5J:
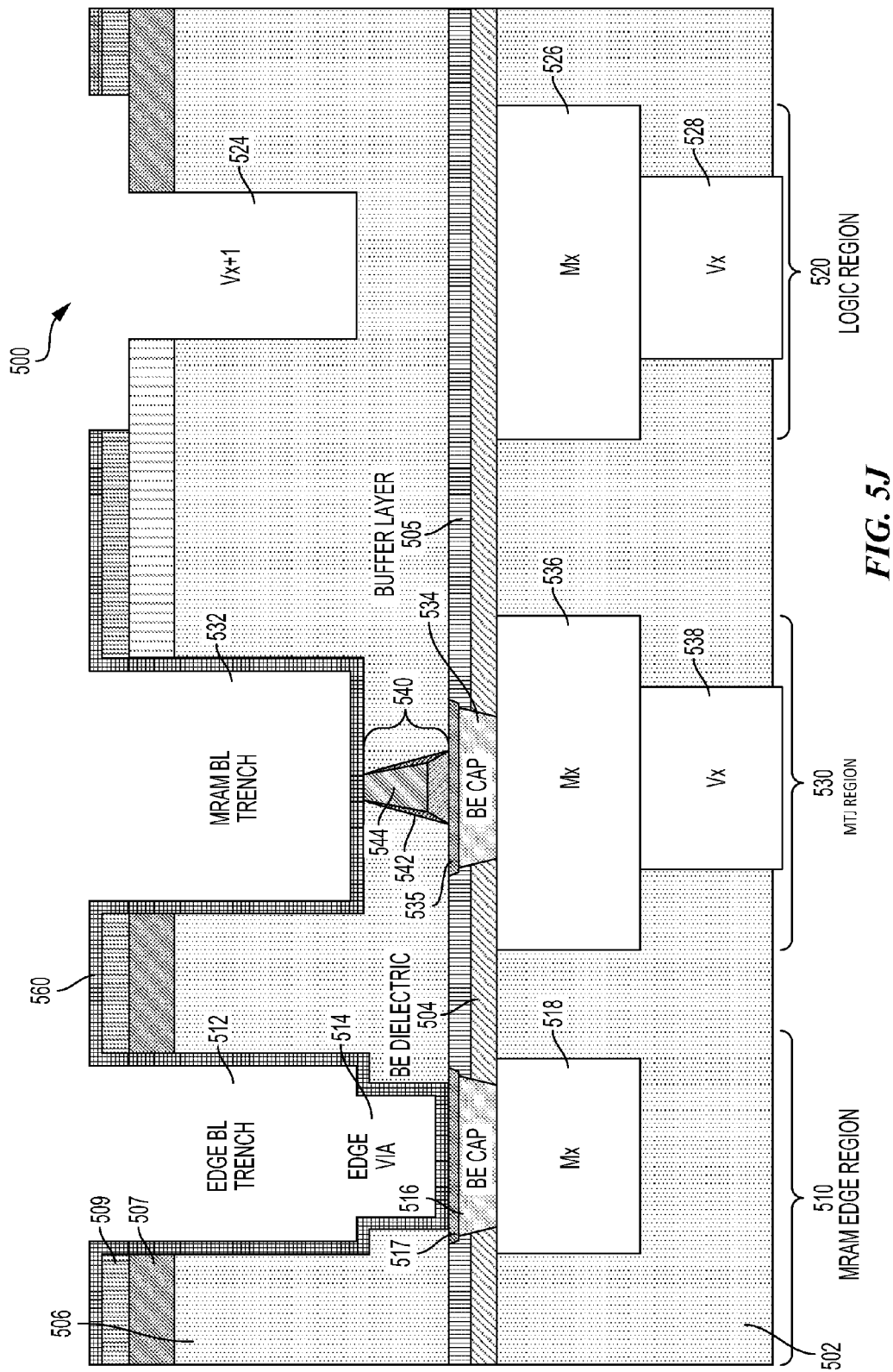

FIG. 5J further illustrates the logic trench lithographic process of FIGURE SI according to aspects of the present disclosure. Representatively, the photoresist layer 511 is stripped from the second conductive barrier liner 560, the edge bit line trench 512 and the memory bit line trench 532. In addition, the edge bit line trench 512, the memory bit line trench 532 and the logic via 524 are selectively etched to open the edge via 514, the edge bit line trench 512, the memory bit line trench 532 and the logic via 524. For example, opened of these features may be performed using oxygen plasma (e.g., to remove the organic spin-on plug) within the features.

Figure 5K:
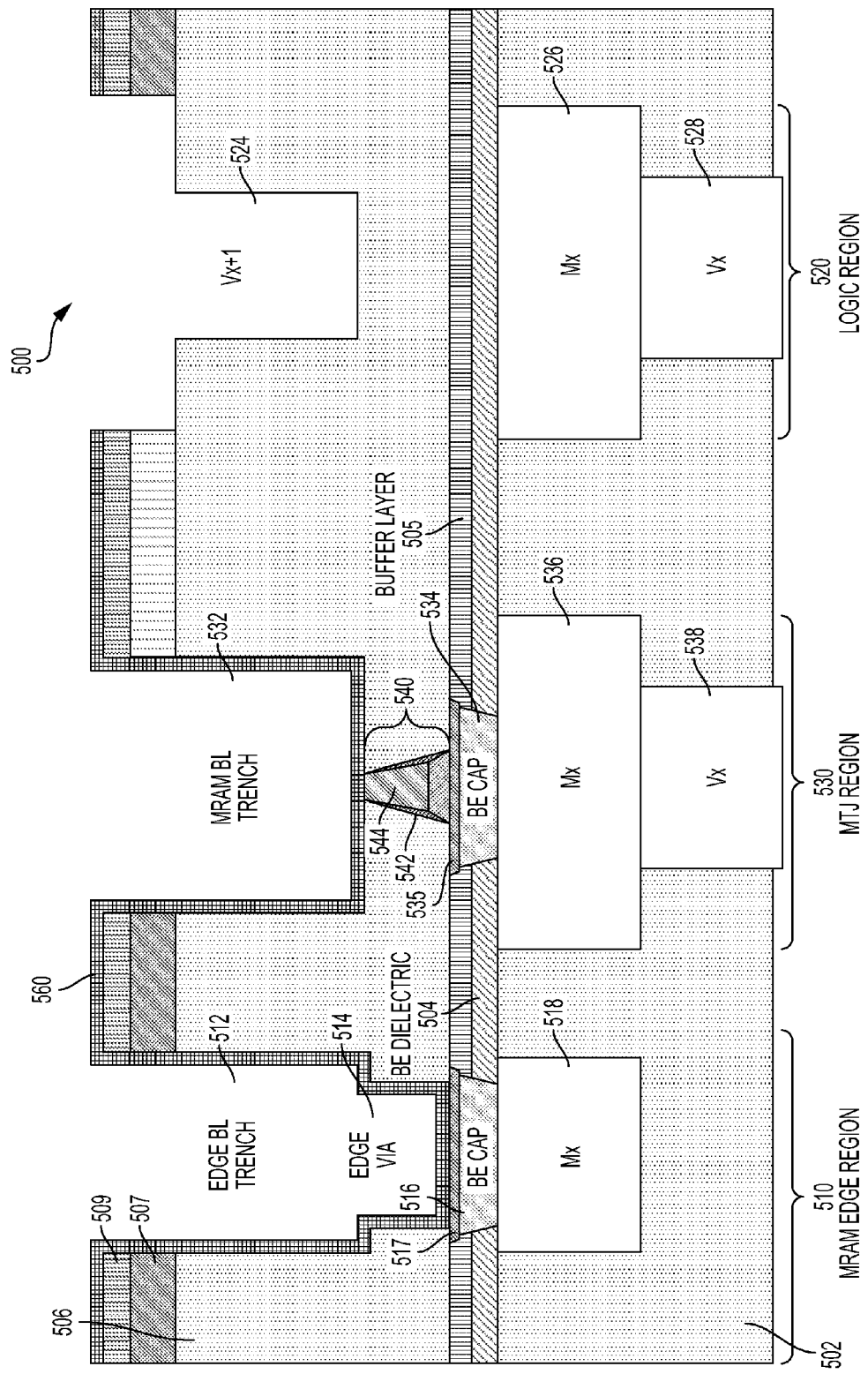
Figure 5L:
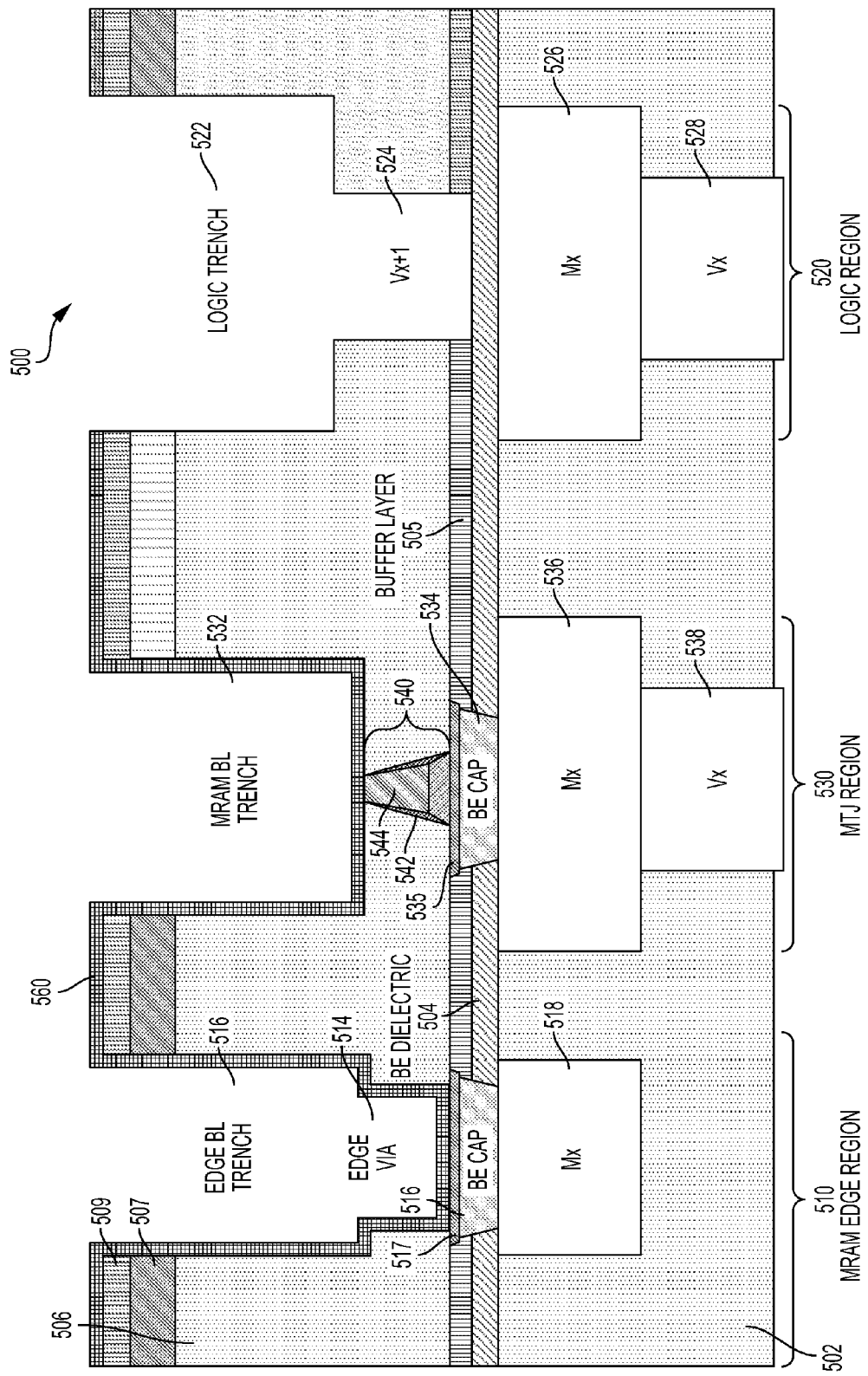

FIG. 5K further illustrates the logic trench lithographic process of FIG. 5J according to aspects of the present disclosure. Representatively, the first hard mask layer 507 is selectively etched to expose the second dielectric layer 506 within the logic region 520. In FIG. 5L, the logic trench lithographic process of FIG. 5K is further illustrated to include formation of a logic trench 522 within the second dielectric layer 506. In addition, the logic via 524 is also formed within the second dielectric layer 506 to land on the BE dielectric layer 504 (e.g., a conductive capping layer). Although the etching used to form the logic trench 522 and the logic via 524 is selective to the second conductive barrier liner 560, the etch may cause surface oxidation to the second conductive barrier liner 560.

FIG. 5M further illustrates the logic trench lithographic process of FIG. 5L according to aspects of the present disclosure. Representatively, the BE dielectric layer 504 is etched so that the logic via 524 lands on the second conductive interconnect 526. In this aspect of the disclosure, an optional sputter clean process is performed on a surface of the second conductive barrier liner 560 to remove any oxide or other like material from the second conductive barrier liner 560. The process used to clean the surface of the second conductive barrier liner 560 should not damage the second dielectric layer 506 within the logic region 520.

Figure 5N:
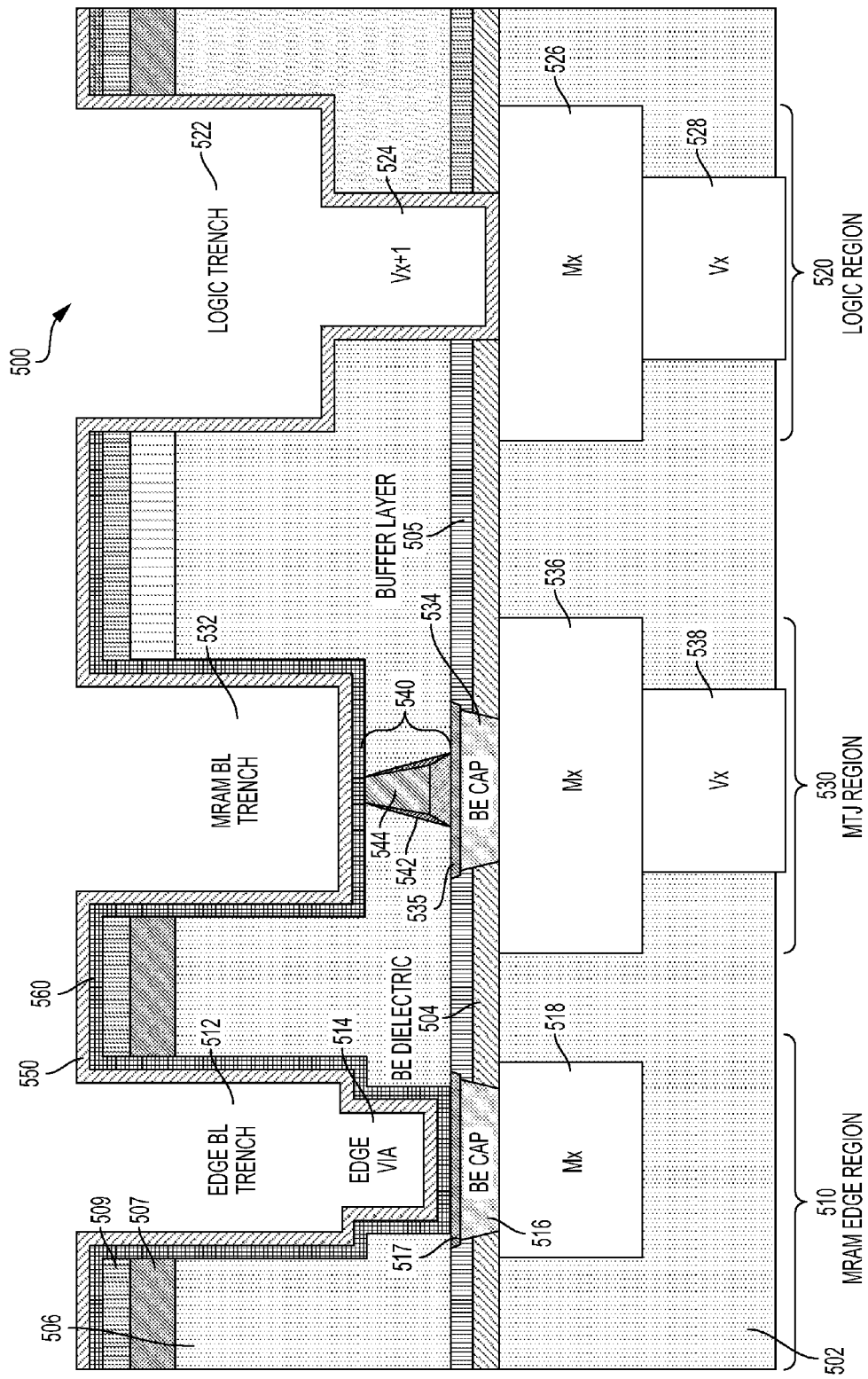
Figure 50:
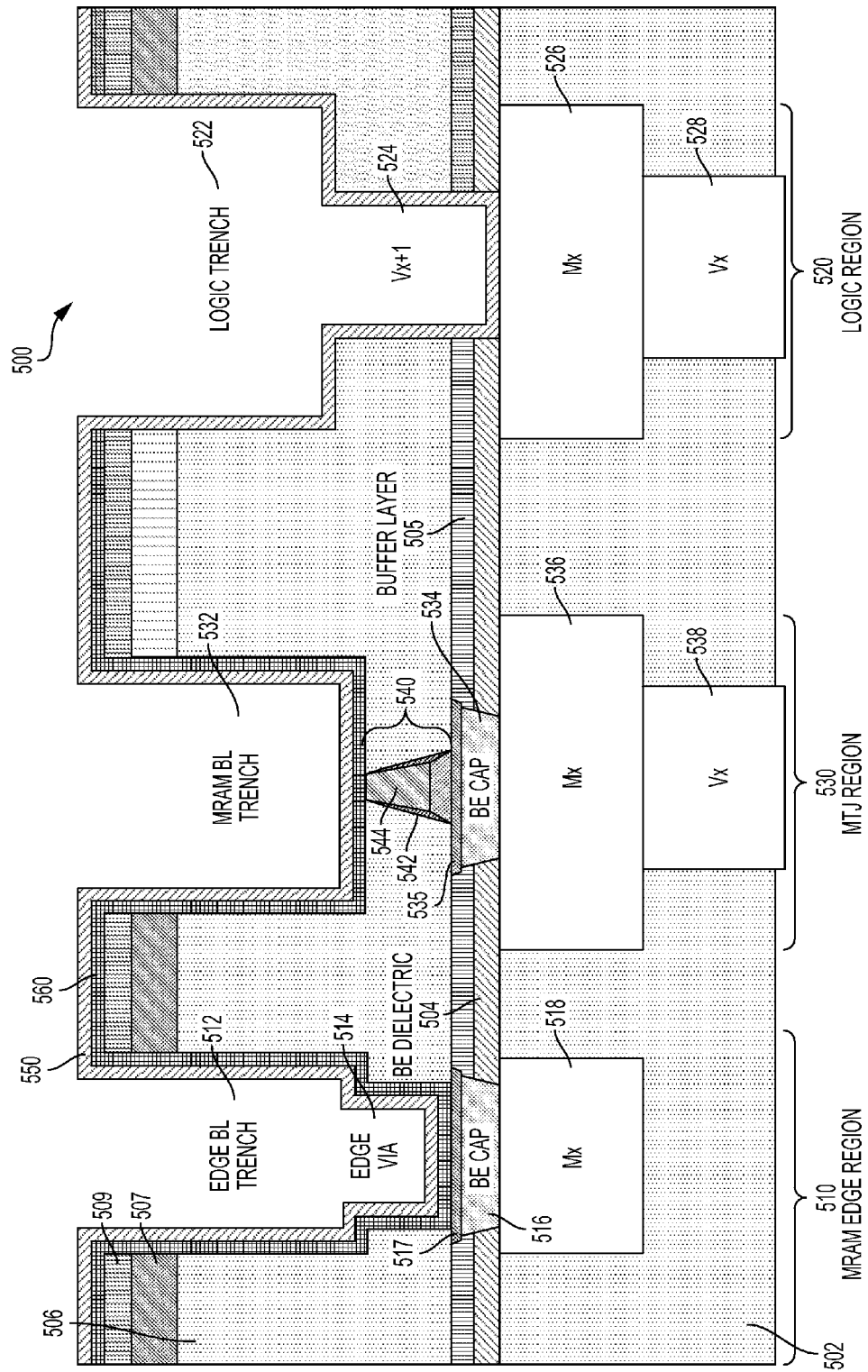

FIG. 5N illustrates deposition of a first conductive barrier liner according to aspects of the present disclosure. Representatively, a first conductive barrier liner 550 (e.g., a Cu barrier metal) is deposited on the second conductive barrier liner 560. In addition, the first conductive barrier liner 550 is deposited on sidewalls of the first hard mask layer 507 and the second hard mask layer 509. The first conductive barrier liner 550 is also deposited on sidewalls and a surface of the logic via 524 that lands on the second conductive interconnect 526. The first conductive barrier liner 550 is further deposited on sidewalls and a surface of the logic trench 522 that lands on the logic via 524.

FIG. 5O illustrates a conductive material according to aspects of the present disclosure. Representatively, a conductive seed layer is deposited within the logic trench 522 and the logic via 524, the memory bit line trench 532, the edge bit line trench 512 and the edge via 514. Next, a conductive material is plated within the logic trench 522 and the logic via 524, the memory bit line trench 532, the edge bit line trench 512 and the edge via 514. A conductive seed layer may be a Cu seed layer and the conductive material may be plated Cu.

Figure 5P:
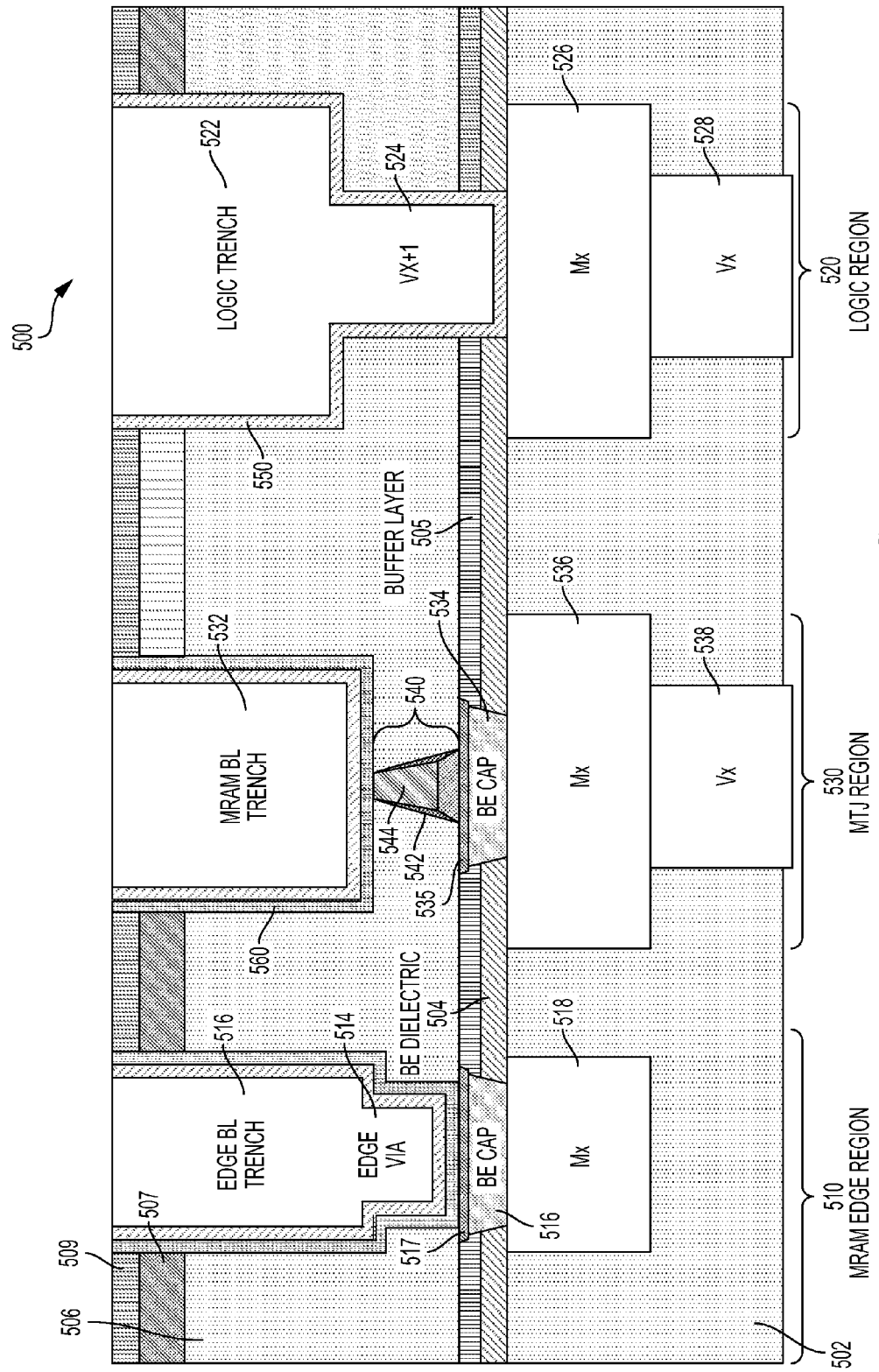
Figure 5Q:
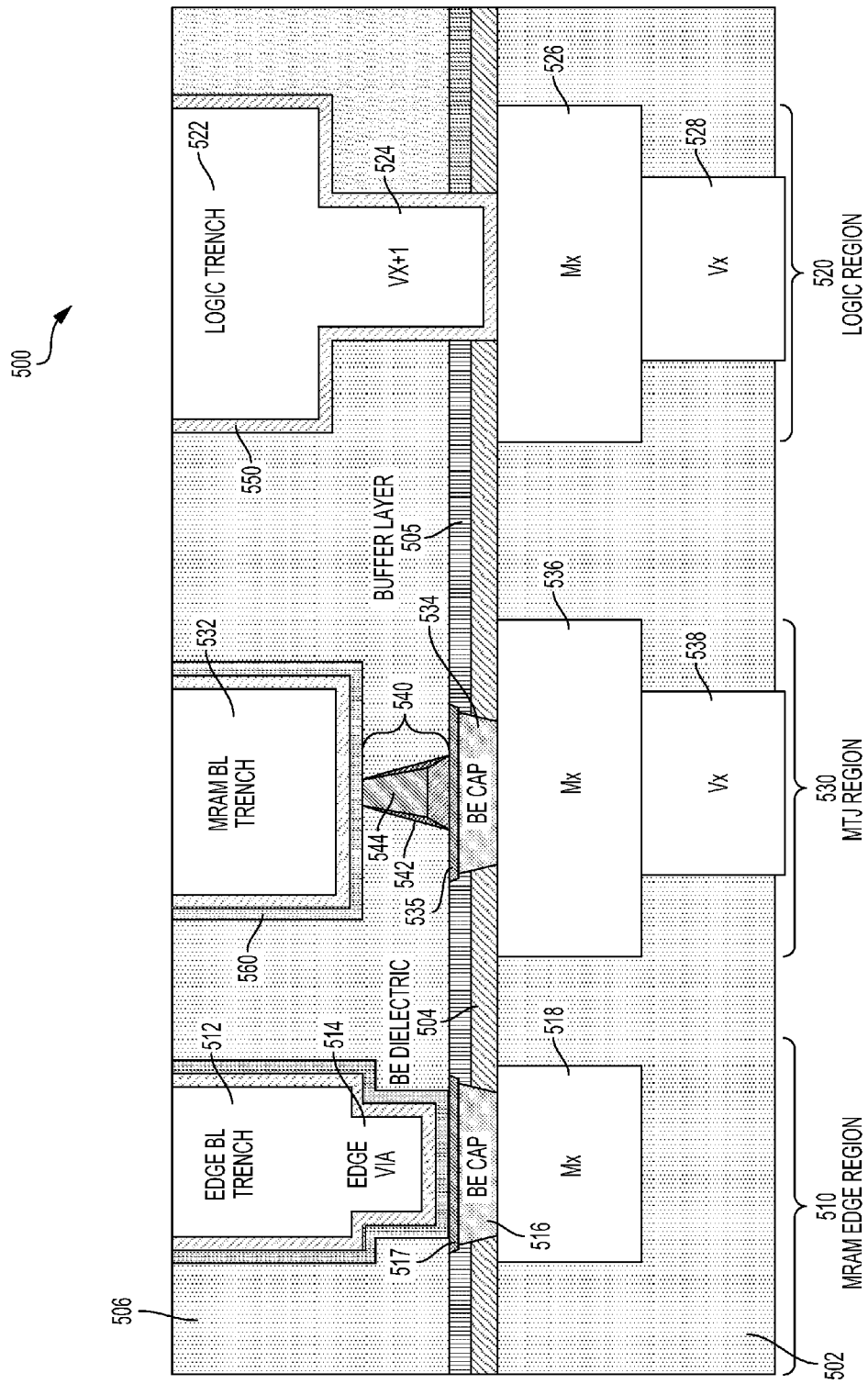

FIG. 5P illustrates a conductive material and barrier liner planarization process according to aspects of the present disclosure. Representatively, a planarization process (e.g., CMP) is applied to the plated conductive layer to stop on the first conductive barrier liner 550. Next, planarization process is applied to the first conductive barrier liner 550 and the second conductive barrier liner 560 to stop on the second hard mask layer 509.

FIG. 5Q further illustrates a hard mask planarization process according to aspects of the present disclosure. Representatively, a planarization process (e.g., CMP) is applied to the second hard mask layer 509 and the first hard mask layer 507 to stop on the second dielectric layer 506. The second hard mask layer 509 may be an oxide layer and the first hard mask layer 507 may be TiN or other like protective material. The semiconductor device 500 is completed by depositing a capping layer on the second dielectric layer 506, the edge bit line trench 512, the memory bit line trench 532 and the logic trench 522 of the semiconductor device 500, for example, as shown in FIG. 6.

As shown in FIG. 6, a memory bit line trench 632 is fabricated prior to fabrication of a logic trench 622 in which the memory bit line trench 632 is lined with a second conductive barrier liner 660. The second conductive barrier liner 660 provides protection for the memory bit line trench 632 during a subsequent fabrication process to form the logic trench 622 adjacent to the memory bit line trench 632. That is, fabrication of the memory bit line trench 632, which is generally uniform (e.g., of a single width and a single space), is separated from fabrication of the logic trench 622, which is non-uniform and generally unlimited in possible directions and dimensions.

In this aspect of the present disclosure, the semiconductor device 600 includes a memory edge region 610, an MTJ region 630 and a logic region 620. The memory edge region 610 includes a first conductive interconnect (Mx) 618 within a first dielectric layer 602. A first bottom electrode cap 616 supporting a bottom electrode contact 617 provides electrical contact between the first conductive interconnect 618 (Mx) and an edge bit line trench 612 through an edge via 614 within a second dielectric layer 606. The logic region 620 includes a second conductive interconnect 626 (Mx) on a via 628 (Vx) within the first dielectric layer 602. A logic via 624 (Vx+1) provides electrical contact between the second conductive interconnect 626 (Mx) and a logic trench 622 through a bottom electrode dielectric 604 and a buffer layer 605 separating the first dielectric layer 602 from the second dielectric layer 606.

In this arrangement, the MTJ region 630 includes a third conductive interconnect 636 (Mx) on an MTJ via 638 (Vx) within the first dielectric layer 602. An MTJ 640 is supported by a second bottom electrode cap 634 and a bottom electrode contact 635 that provides electrical contact to the MTJ via 638 (Vx) through the third conductive interconnect 636 (Mx). A memory bit line trench 632 may contact a hard mask 644 and an encapsulation layer 642 of the MTJ 640. A capping layer 608 is disposed on the edge bit line trench 612, the memory bit line trench 632, the logic trench 622 and the second dielectric layer 606.

Figure 7:
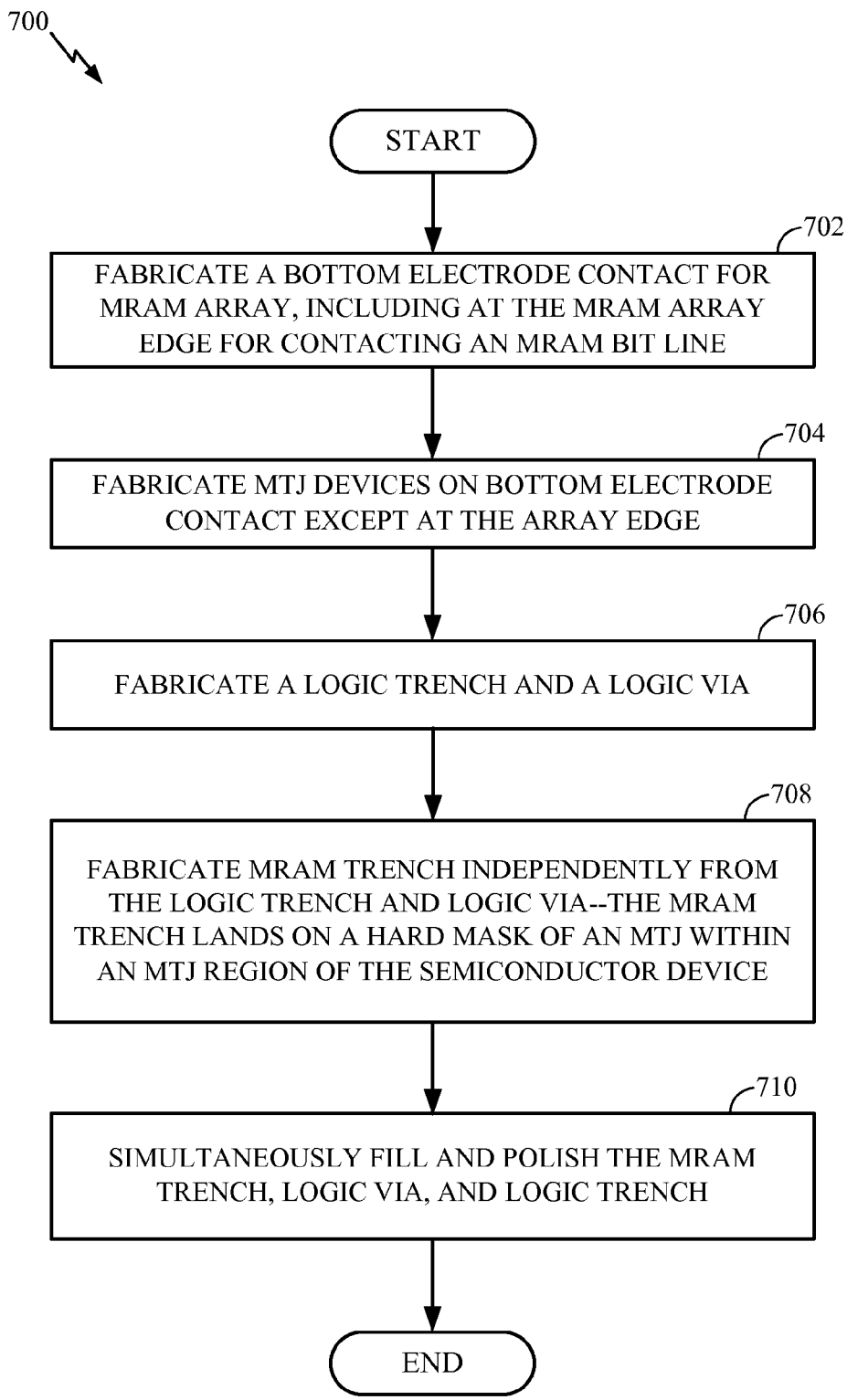
FIG. 7 is a process flow diagram illustrating a process of fabricating a semiconductor device according to an aspect of the present disclosure.

A method of fabricating a semiconductor device is described with reference to FIG. 7. The method 700 includes fabricating a bottom electrode contact for an MRAM array, including at the MRAM array edge for contacting an MRAM bit line at block 702. The method 700 also includes fabricating MTJ devices on bottom electrode contacts, except at the edge of the MRAM array at block 704. In addition, the method 700 includes fabricating a logic trench and a logic via, at block 706. For example, as shown in FIG. 5J to 5M, the logic via 524 and the logic trench 522 are fabricated subsequent to fabrication of the memory bit line trench 532, the edge bit line trench 512 and the edge via 514. The method further includes fabricating an MRAM trench independently from fabricating the logic trench and logic via, at block 708. In this arrangement, the MRAM trench lands on a hard mask of an MTJ within an MTJ region of the semiconductor device. For example, as shown in FIG. 5G, the memory bit line trench, including the second conductive barrier liner 560 lands on an exposed portion of the conductive hard mask 544 of the MTJ 540.

The method also includes simultaneously filling and polishing the MRAM trench, logic via, and logic trench, at block 710. For example, as shown in FIGS. 5O to 5Q, the edge bit line trench 512, the edge via 514, the memory bit line trench 532, the logic trench 522 and the logic via 524 are simultaneously filled and polished. The fabrication of the edge bit line trench 512, the edge via 514 and the memory bit line trench 532 is performed prior to fabrication of the logic trench 522 and the logic via 524. In addition, the edge bit line trench 512, the edge via 514 and the memory bit line trench 532 are lined with both the second conductive barrier liner 560 and the first conductive barrier liner 550. In contrast, the logic trench 522 and the logic via 524 are lined with just the first conductive barrier liner 550.

In aspects of the present disclosure, providing reliable electrical contact to a p-MTJ includes separating fabrication of a memory bit line trench from fabrication of an adjacent logic trench. In this aspect of the present disclosure, a memory bit line trench is fabricated prior to fabrication of a logic trench in which the memory bit line trench is lined with a first conductive barrier liner. The first conductive barrier liner provides protection during a subsequent fabrication process to form the adjacent logic trench. Fabrication of the memory bit line trench, which is generally uniform (e.g., of a single width and a single space), is separated from fabrication of the adjacent logic trench, which can be non-uniform and unlimited in possible directions and dimensions.

Separately fabricating the memory bit line trench improves a process margin for contacting an active surface of the magnetic tunnel junction (MTJ), while preserving, for example, a standard logic low-dielectric constant BEOL process. In particular, two distinct trench etch steps are performed to fabricate the memory bit line trench and the adjacent logic trench. In this arrangement, the memory bit line trench is concurrently formed with an edge via at certain locations in the bit line trench, with each trench lined with the second conductive barrier liner. Following the subsequent fabrication of the logic trench, the logic trench, the memory bit line trench and the edge via are lined with a first conductive barrier liner. In addition, a separate landing is provided for a memory array edge via and a general logic via.

According to an aspect of the present disclosure, a semiconductor device includes a magnetoresistive random-access memory (MRAM) trench having a first conductive barrier liner and a second conductive barrier liner is described. The MRAM trench may land on a hard mask of a magnetic tunnel junction (MTJ) within an MTJ region of the semiconductor device. The semiconductor device may also include a logic trench having the first conductive barrier liner. The semiconductor device may further include a logic via having the first conductive barrier liner. In one configuration, the logic via lands on a first portion of a means for interconnecting within a logic region of the semiconductor device. The interconnecting means may be the first conductive interconnect (Mx) 418/518/618, the second conductive interconnect (Mx) 428/528/628 or the third conductive interconnect (Mx) 438/538/638. In another aspect, the aforementioned means may be any module or any apparatus or material configured to perform the functions recited by the aforementioned means.

Figure 8:
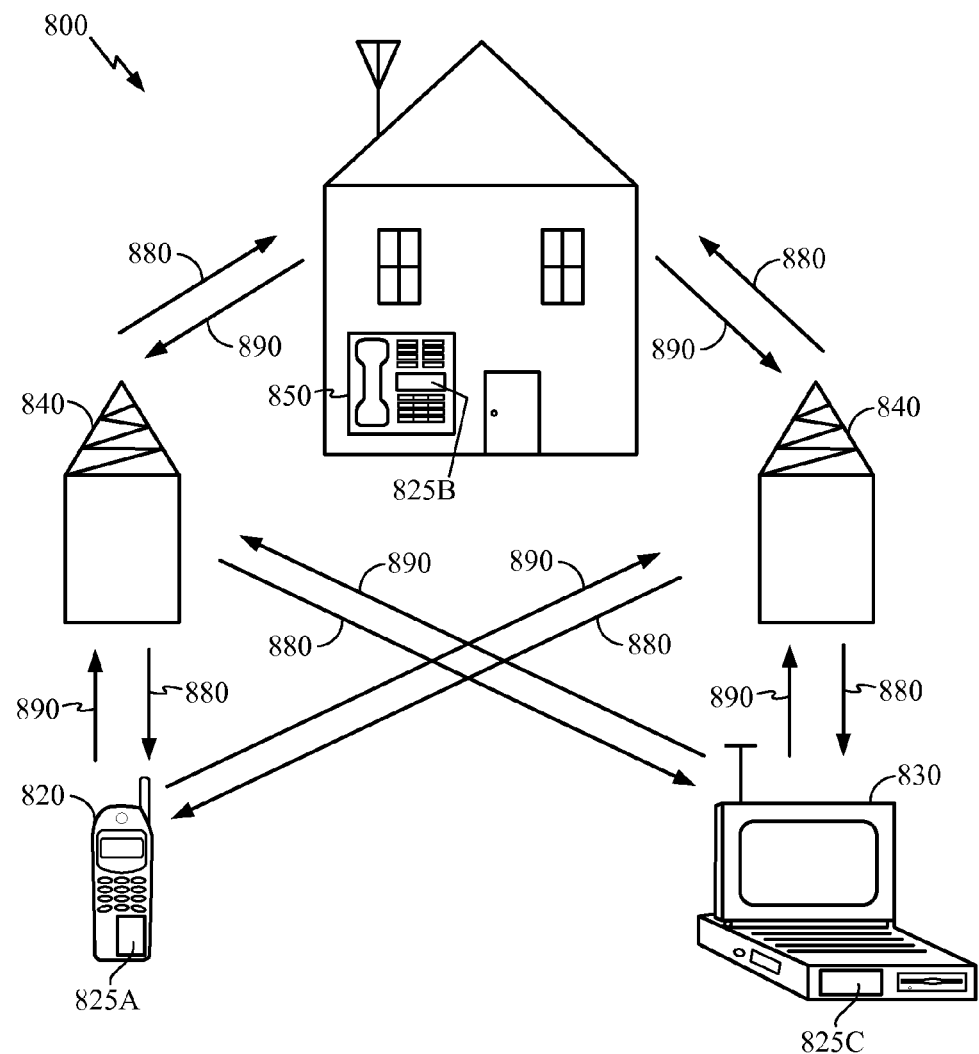
FIG. 8 is a block diagram showing an exemplary wireless communication system in which a configuration of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed devices. It will be recognized that other devices may also include the disclosed devices, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit such as personal digital assistant (PDA), a GPS enabled device, a navigation device, a set top box, a music player, a video player, an entertainment unit, a fixed location data unit such as a meter reading equipment, or a communications device that stores or retrieves data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed devices.

Figure 9:
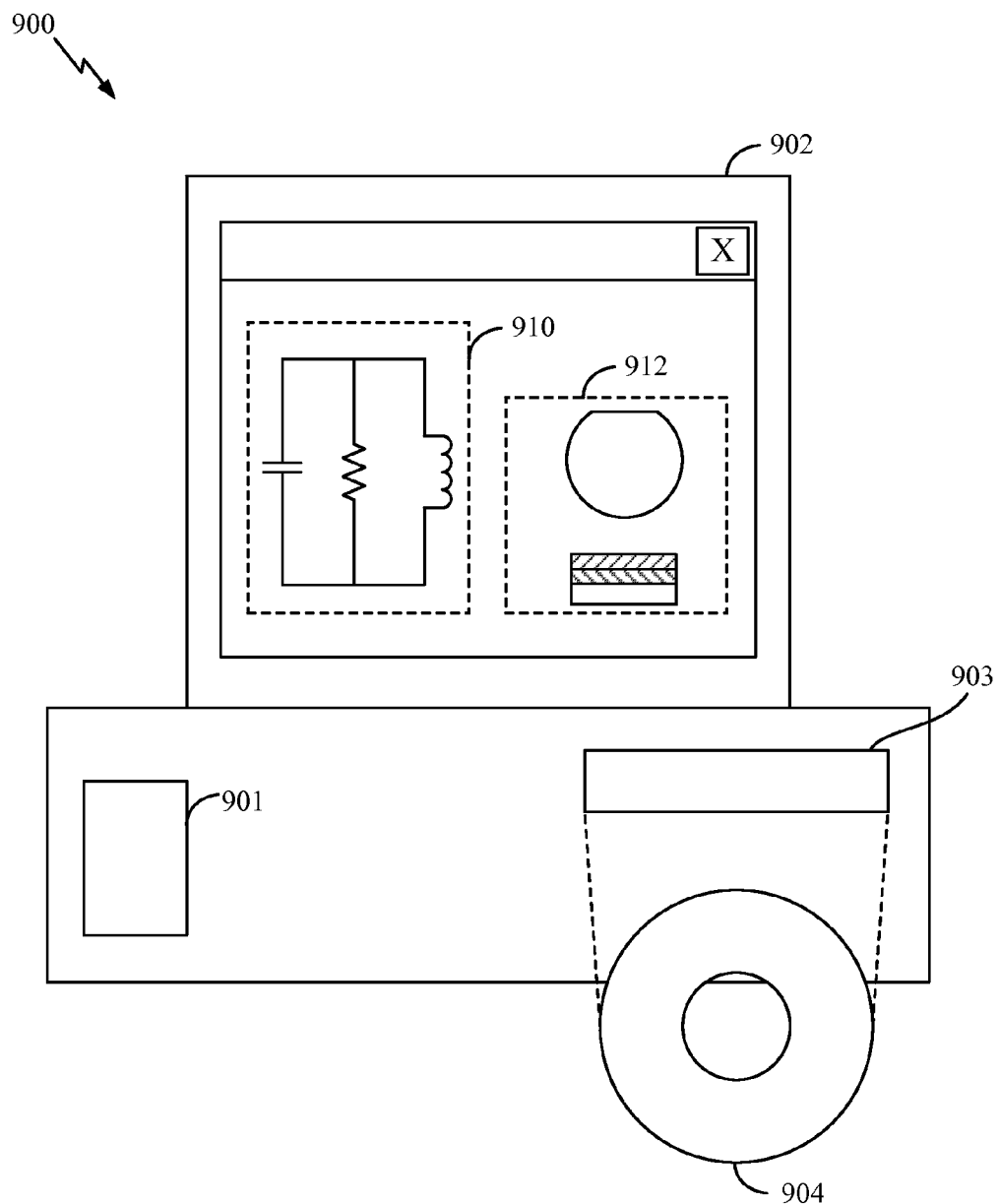
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the perpendicular magnetic tunnel junction structures disclosed above. A design workstation 900 includes a hard disk 901 containing operating system software, support files, and design software such as Cadence or OrCAD. The design workstation 900 also includes a display 902 to facilitate design of a circuit 910 or a semiconductor component 912 such as a perpendicular magnetic tunnel junction structure in accordance with an aspect of the present disclosure. A storage medium 904 is provided for tangibly storing the design of the circuit 910 or the semiconductor component 912. The design of the circuit 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the semiconductor component 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core), or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "a step for."

What is claimed is:

1. A semiconductor device including a magnetic tunnel junction (MTJ) region and a logic region adjacent to the MTJ region, the device comprising:
   a magnetoresistive random-access memory (MRAM) trench within the MTJ region of the semiconductor device, the MRAM trench comprising a first conductive barrier liner and a second conductive barrier liner, the MRAM trench having a flat portion landing no deeper than an adjoining surface of a hard mask and an encapsulation layer of an MTJ within the MTJ region of the semiconductor device, in which the second conductive barrier liner is on sidewalls and a surface of the MRAM trench, and the first conductive barrier liner is on the second conductive barrier liner;
   a logic trench comprising the first conductive barrier liner; and
   a logic via comprising the first conductive barrier liner, the logic via landing on a first portion of a conductive interconnect (Mx) within the logic region of the semiconductor device.

2. The semiconductor device of claim 1, further comprising an edge via and an edge trench comprising the first conductive barrier liner and the second conductive barrier liner, the edge via landing on a bottom electrode contact of a bottom electrode coupled to a second portion of the conductive interconnect (Mx).

3. The semiconductor device of claim 1 in which the first conductive barrier liner comprises ruthenium (Ru), cobalt (Co), and/or manganese (Mn).

4. The semiconductor device of claim 1 further comprising a capping layer on the MRAM trench and the logic trench.

5. The semiconductor device of claim 1, integrated into a mobile phone, a set top box, a music player, a video player, an entertainment unit, a navigation device, a computer, a hand-held personal communication systems (PCS) unit, a portable data unit, and/or a fixed location data unit.

6. A semiconductor device including a magnetic tunnel junction (MTJ) region and a logic region adjacent to the MTJ region, the device comprising:
   a magnetoresistive random-access memory (MRAM) trench within the MTJ region of the semiconductor device, the MRAM trench comprising a first conductive barrier liner and a second conductive barrier liner, the MRAM trench having a flat portion landing no deeper than an adjoining surface of a hard mask and an encapsulation layer of an MTJ within the MTJ region of the semiconductor device, in which the second conductive barrier liner is on sidewalls and a surface of the MRAM trench, and the first conductive barrier liner is on the second conductive barrier liner;
   a logic trench comprising the first conductive barrier liner; and a logic via comprising the first conductive barrier liner, the logic via landing on a first portion of a means for interconnecting within the logic region of the semiconductor device.

7. The semiconductor device of claim 6, further comprising an edge via and an edge trench comprising the first conductive barrier liner and the second conductive barrier liner, the edge via landing on a bottom electrode contact of a bottom electrode coupled to a second portion of the interconnecting means.

8. The semiconductor device of claim 6 in which the first conductive barrier liner comprises ruthenium (Ru), cobalt (Co), and/or manganese (Mn).

9. The semiconductor device of claim 6 further comprising a capping layer on the MRAM trench and the logic trench.

10. The semiconductor device of claim 6, integrated into a mobile phone, a set top box, a music player, a video player, an entertainment unit, a navigation device, a computer, a hand-held personal communication systems (PCS) unit, a portable data unit, and/or a fixed location data unit.

* * * * *